(12) United States Patent
Lundstrum et al.

(10) Patent No.: US 8,847,802 B2
(45) Date of Patent: Sep. 30, 2014

(54) MICROCONTROLLER ADC WITH A VARIABLE SAMPLE AND HOLD CAPACITOR

(71) Applicant: Microchip Technology Incorporated, Chandler, AZ (US)

(72) Inventors: Zeke Lundstrum, Chandler, AZ (US); Keith Curtis, Gilbert, AZ (US); Burke Davison, Chandler, AZ (US); Sean Steedman, Phoenix, AZ (US); Yann LeFaou, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/644,818

(22) Filed: Oct. 4, 2012

(65) Prior Publication Data

US 2013/0088377 A1    Apr. 11, 2013

Related U.S. Application Data

(60) Provisional application No. 61/544,183, filed on Oct. 6, 2011.

(51) Int. Cl.
*H03M 1/00* (2006.01)

(52) U.S. Cl.
USPC .......................................... 341/141; 341/155

(58) Field of Classification Search
USPC .......... 341/141, 122, 142; 324/686, 663, 661, 324/658; 345/173, 174; 700/79
See application file for complete search history.

(56) References Cited

U.S. PATENT DOCUMENTS

| | | | |
|---|---|---|---|
| 3,295,121 A | 12/1966 | Scheel | 340/629 |
| 3,832,678 A | 8/1974 | Gysell et al. | 340/587 |
| 4,213,047 A | 7/1980 | Mccord | 250/381 |
| 4,538,137 A | 8/1985 | Kimura | 340/512 |
| 4,652,866 A | 3/1987 | Siegmann et al. | 340/628 |
| 5,243,330 A | 9/1993 | Thuillard | 340/629 |
| 5,422,807 A * | 6/1995 | Mitra et al. | 700/79 |
| 5,705,988 A | 1/1998 | Mcmaster | 340/628 |
| 6,433,712 B1 | 8/2002 | Ohnhaeuser et al. | 341/118 |
| 6,981,090 B1 | 12/2005 | Kutz et al. | 710/317 |
| 7,307,485 B1 | 12/2007 | Snyder et al. | 331/150 |
| 7,382,140 B2 | 6/2008 | Obrecht | 324/678 |
| 7,460,441 B2 | 12/2008 | Bartling | 368/118 |

(Continued)

FOREIGN PATENT DOCUMENTS

| | | | | |
|---|---|---|---|---|
| DE | 102009030495 A1 | 1/2011 | | G01B 7/00 |
| EP | 1719947 A1 | 11/2006 | | F23N 5/12 |

(Continued)

OTHER PUBLICATIONS

Yair, R., "Charge Sampling Method for Low Current Measurement," Review of Scientific Instruments, vol. 45, No. 3, 6 pages, Mar. 1974

(Continued)

*Primary Examiner* — Joseph Lauture
(74) *Attorney, Agent, or Firm* — King & Spalding L.L.P.

(57) ABSTRACT

An ADC module includes an analog to digital converter coupled with an analog bus, wherein the an analog to digital converter comprises a main sample and hold capacitor; and a plurality of additional sample and hold capacitances which can be programmably coupled in parallel with said main sample and hold capacitance.

16 Claims, 22 Drawing Sheets

(56) References Cited

U.S. PATENT DOCUMENTS

| | | | |
|---|---|---|---|
| 7,764,213 B2 | 7/2010 | Bartling et al. | 341/152 |
| 2002/0153923 A1 | 10/2002 | Piasecki et al. | 326/57 |
| 2007/0075710 A1 | 4/2007 | Hargreaves et al. | 324/658 |
| 2008/0272826 A1 | 11/2008 | Smit et al. | 327/509 |
| 2008/0312857 A1 | 12/2008 | Sequine | 702/65 |
| 2010/0102832 A1 | 4/2010 | Bartling et al. | 324/679 |
| 2010/0181180 A1 | 7/2010 | Peter | 200/5 R |
| 2010/0231241 A1 | 9/2010 | Mueck et al. | 324/686 |
| 2010/0283760 A1 | 11/2010 | Leung et al. | 345/174 |
| 2011/0007028 A1 | 1/2011 | Curtis et al. | 345/174 |
| 2011/0267309 A1 | 11/2011 | Hanauer et al. | 345/174 |

FOREIGN PATENT DOCUMENTS

| | | | |
|---|---|---|---|
| FI | 2473201 A1 | 7/1981 | G08B 17/11 |
| GB | 1598821 A | 9/1981 | G08B 17/11 |
| GB | 2117560 A | 10/1983 | G01N 27/64 |
| GB | 2156126 A | 10/1985 | G08B 17/00 |
| WO | 2006/138205 A1 | 12/2006 | H03M 1/06 |

OTHER PUBLICATIONS

Margarita, Andrey, "Application Note AN2245: Smart Smoke Detector," Cypress Semiconductor Corporation, XP055054690, URL: http://www.psocdeveloper.com/uploads/tx_piapappnote/an2245_01.pdf, 12 pages, Feb. 22, 2005.

Perme, Thomas, "AN1101: Introduction to Capacitive Sensing," Microchip Technology, Inc., XP002693941, URL: http://ww1.microchip.com/downloads/en/AppNotes/01101A.pdf, 10 pages, Jun. 25, 2007.

Anonymous, "Delta-Sigma Modulation," Wikipedia, URL: http://en.wikipedia.org/w/index.php?title=Special:Book&bookcmd=download&collection_id=fa136df1282a073a&writer=rl&return_to=Delta-sigma modulation, 14 pages, 2012.

International Search Report and Written Opinion, Application No. PCT/US2012/058716, 10 pages, Mar. 15, 2013.

International Search Report and Written Opinion, Application No. PCT/US2012/069086, 10 pages, Apr. 5, 2013.

International Search Report and Written Opinion, Application No. PCT/US2012/069094, 12 pages, Apr. 5, 2013.

International Search Report and Written Opinion, Application No. PCT/US2012/058688, 11 pages, Apr. 5, 2013.

International Search Report and Written Opinion, Application No. PCT/US2012/069076, 11 pages, Apr. 10, 2013.

International Search Report and Written Opinion, Application No. PCT/US2012/070466, 13 pages, Apr. 24, 2013.

International Search Report and Written Opinion, Application No. PCT/US2012/058837, 14 pages, Feb. 18, 2013.

International Search Report and Written Opinion, Application No. PCT/US2012/058832, 11 pages, Jan. 22, 2013.

Bohn, Bruce, "AN1250: Microchip CTMU for Capacitive Touch Applications," Microchip Technology, Inc., XP055007432, URL: http://www.microchip.com/stellent/idcplg?IdcService=SS_GET_PAGE&nodeID=1824&appnote=en539441, 22 pages, Feb. 3, 2009.

Perme, Thomas et al., AN1298: Capacitive Touch Using Only an ADC ("CVD"), Microchip Technology, Inc., XP055007357, URL: http://www.microchip.com/stellent/idcplg?IdcService=SS_GET_PAGE&nodeId=1824&appnote=en545264, 4 pages, Oct. 7, 2009.

Davison, Burke, "AN1334: Techniques for Robust Touch Sensing Design," Microchip Technology, Inc., XP055047201, URL: http://www.microchip.com/downloads/en/AppNotes/01334A.pdf, 28 pages, Aug. 6, 2010.

Yedamale, Padmaraja et al., "AN1375: See What You Can Do with the CTMU," Microchip Technology, Inc., XP055047211, URL: http://www.microchip.com/downloads/en/AppNotes/CTMU%2001375a.pdf, 12 pages, May 11, 2011.

International Search Report and Written Opinion, Application No. PCT/US2012/058682, 12 pages, Dec. 17, 2012.

International Search Report and Written Opinion, Application No. PCT/US2012/058691, 13 pages, Dec. 19, 2012.

International Search Report and Written Opinion, Application No. PCT/US2013/052956, 12 pages, Jan. 28, 2014.

\* cited by examiner

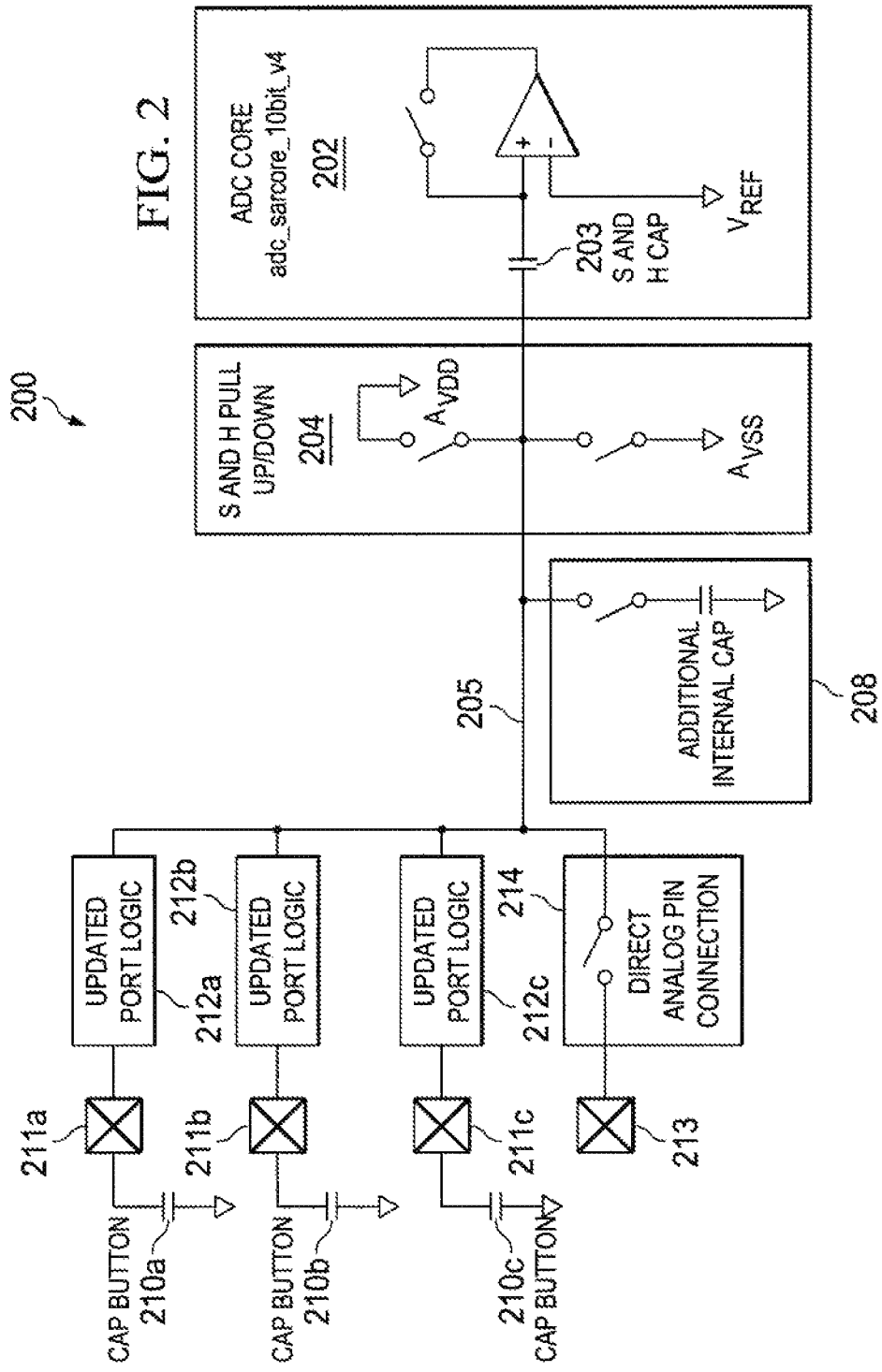

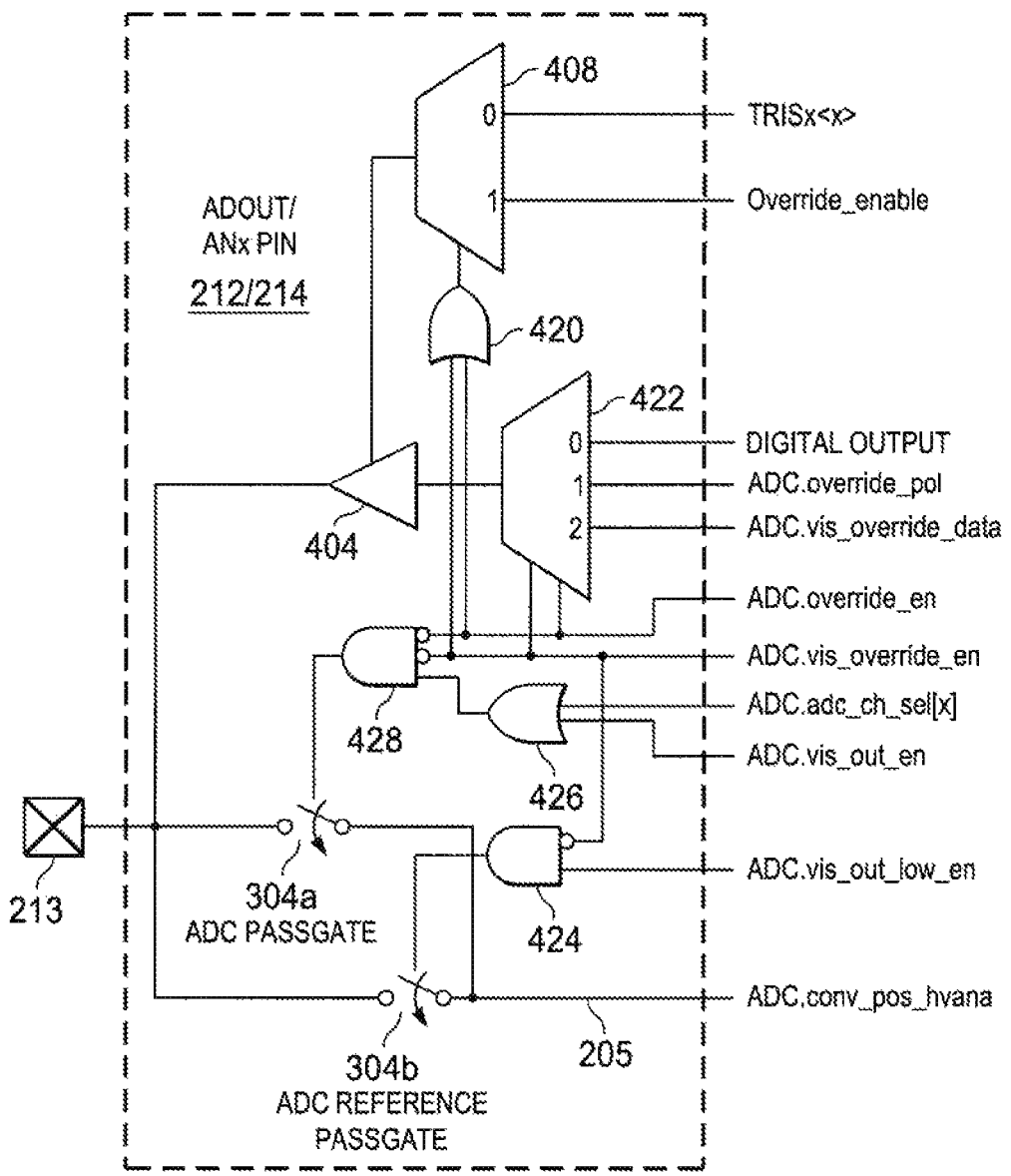

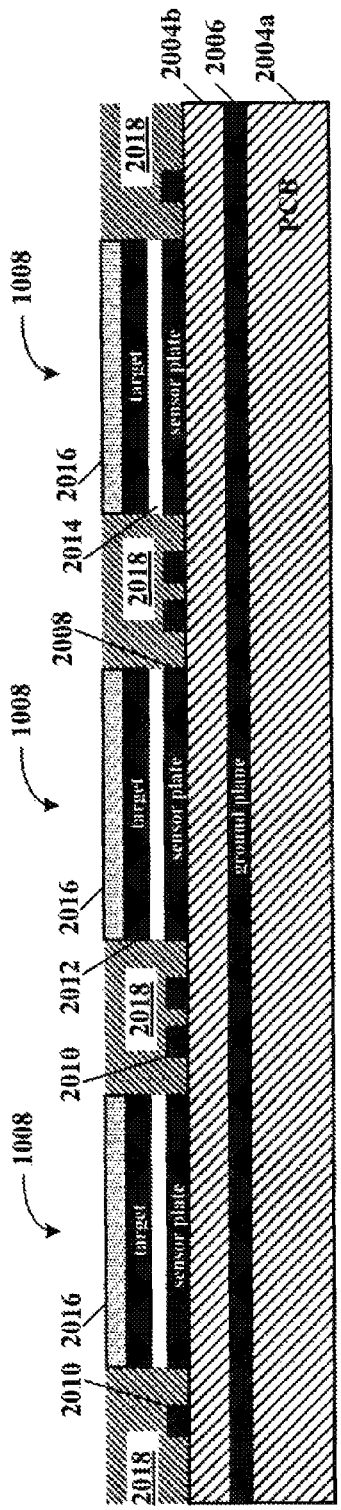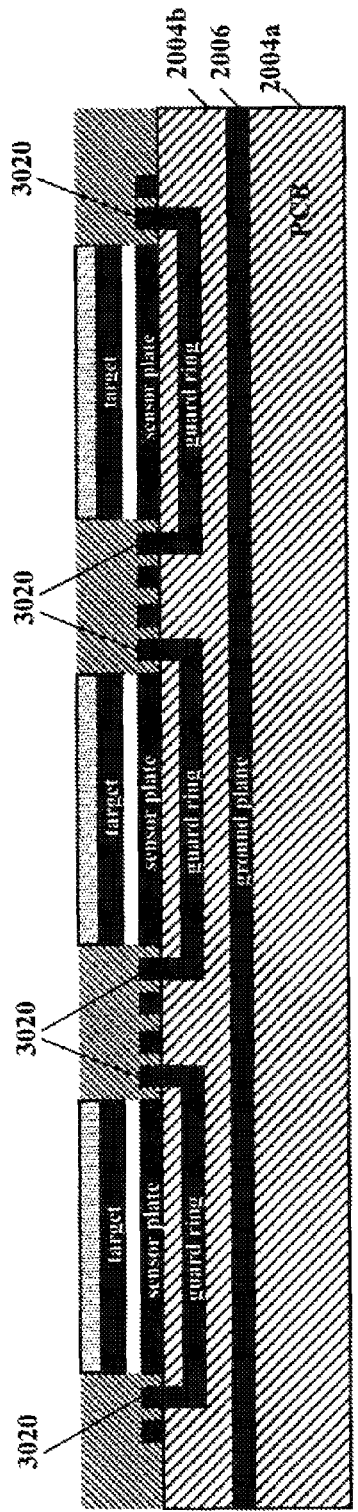

MICROCONTROLLER ADC WITH A VARIABLE SAMPLE AND HOLD CAPACITOR

CROSS REFERENCE TO RELATED APPLICATIONS

This application claims priority to U.S. Provisional Application Ser. No. 61/544,183, titled, "Microcontroller ADC with a Variable Sample and Hold Capacitor," filed Oct. 6, 2011, which is hereby incorporated by reference in its entirety as if fully set forth herein.

TECHNICAL FIELD

The present disclosure relates to analog to digital converters, in particular for use in a microcontroller and, more particularly, for use in microcontroller with capacitive touch sensing circuitry.

BACKGROUND

Touching of a capacitive sensor by a human hand or finger, or approaching a capacitive proximity sensor changes certain parameters thereof, in particular the capacitance value of a capacitor that is built into the touch sensor used, for example, in human to machine interface devices, e.g., keypad or keyboard. Microcontrollers now include peripherals that enhance the detection and evaluation of such capacitive touch sensors. One such application utilizes capacitive voltage division (CVD) to evaluate whether a capacitive touch element has been touched or not.

The resolution of capacitive touch systems is limited by the capacitance of the sensor, both the actual sensor and system parasitic capacitances. However, when such sensors are operated in high noise environments with high bulk capacitance, the resolution in conventional systems may not suffice.

SUMMARY

According to various embodiments, a sample-and-hold capacitance can be adjusted under software control by a user to more closely match a sensor capacitance.

A microcontroller according to some embodiments includes a plurality of ports coupled with an analog bus; an analog to digital converter coupled with the analog bus, wherein the an analog to digital converter comprises a main sample and hold capacitor; and a plurality of additional sample and hold capacitances which can be programmably coupled in parallel with said main sample and hold capacitance.

An ADC module in accordance with some embodiments includes an analog to digital converter coupled with an analog bus, wherein the an analog to digital converter comprises a main sample and hold capacitor; and a plurality of additional sample and hold capacitances which can be programmably coupled in parallel with said main sample and hold capacitance.

A method according to some embodiments includes providing a plurality of ports coupled with an analog bus; providing an analog to digital converter coupled with the analog bus, wherein the an analog to digital converter comprises a main sample and hold capacitor; and providing a plurality of additional sample and hold capacitances which can be programmably coupled in parallel with said main sample and hold capacitance.

BRIEF DESCRIPTION OF THE DRAWINGS

FIG. 2 is a high-level block diagram of an ADC system according to various embodiments;

FIGS. 4A and 4B illustrate multi-function port logic that supports a digital I/O and an analog function via an analog pass gate switch wherein the analog function can be overridden to precharge and discharge a capacitive touch sensor connected to the port with ADC controller logic, according to the teachings of this disclosure;

FIG. 21 illustrates a schematic elevational view of capacitive sensor keys shown in FIG. 1; and FIG. 22 illustrates a schematic elevational view of capacitive sensor keys shown in FIG. 1 and having capacitive guard rings around each of the capacitive sensors, according to a specific example embodiment of this disclosure.

DETAILED DESCRIPTION

Figure 1:
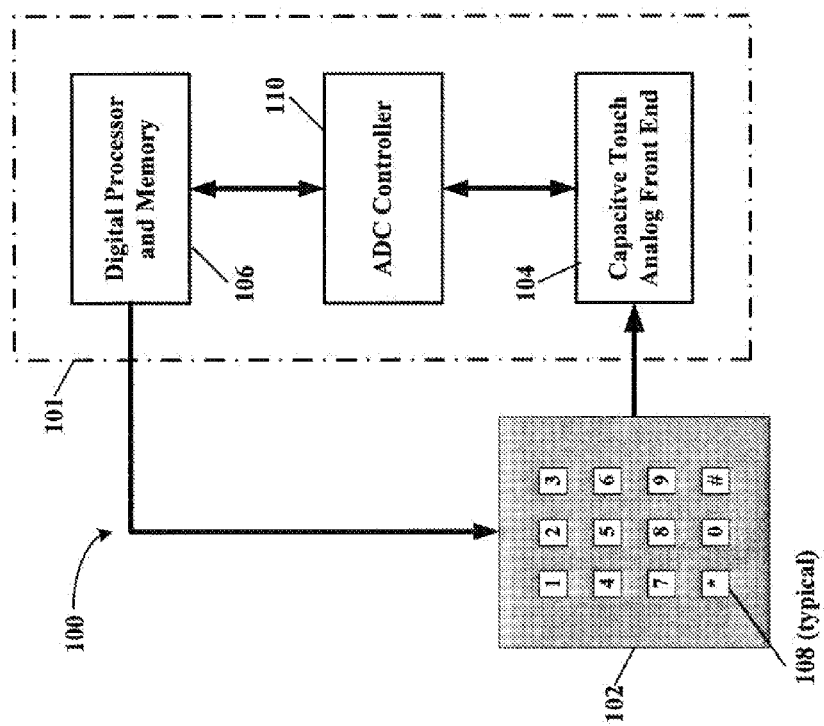
FIG. 1 illustrates a schematic block diagram of an electronic system having a capacitive touch keypad, a capacitive touch analog front end and a digital processor, according to an embodiment.

In a CVD system, the greatest resolution is achieved when the sensor and sample-and-hold capacitors are approximately equal. In accordance with embodiments, additional sample and hold capacitances are provided and may be programmably added to the existing sample and hold capacitor. Thus, this circuitry allows the user to increase the size of the sample-and-hold capacitor for systems with large capacitance sensors. According to one embodiment, a user can program a register which controls the switches to add additional sample & hold capacitance in parallel to a main sample & hold capacitance.

According to other embodiments, software or firmware can be implemented that would first perform a conversion on each of the capacitive sensors, using the CVD (capacitive voltage division) method of capacitance to digital conversion, then determine the optimum sample & hold capacitance for each sensor and preset the sample-and-hold capacitance prior to each sensor's conversion for maximum resolution.

Hence, the system may further include a control unit implemented on or with the microcontroller, for example a state machine, that automatically measures the external sensor capacitance of each capacitive sensor connected to the microcontroller. Thus, during a calibration phase, these values can be determined and stored in a calibration table. This table may then be used to adjust the additional capacitances of the sample & hold capacitors when the respective port connected to the external sensor is coupled with the ADC unit for measurement.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an electronic system having a capacitive touch keypad, a capacitive touch analog front end and a digital processor, according to the teachings of this disclosure. A microcontroller integrated circuit device 101 may include a digital processor and memory 106, an analog-to-digital converter (ADC) controller 110, one or more of input-output (I/O) ports (nodes), an analog-to-digital converter (ADC), precision timers, multifunction input and output nodes, digital-to-analog converter (DAC) or combinations thereof. A capacitive touch analog front end (AFE) 104 may be implemented with some of the aforementioned functions of the microprocessor 101. The capacitive touch AFE 104 may be coupled to a matrix of capacitive sensor keys 102, e.g., pushbuttons, levers, toggles, targets, handles, knobs, etc., through an analog multiplexer (not shown).

The ADC controller 110 and capacitive touch AFE 104 facilitate, with a single low-cost integrated circuit microcontroller 101, all active functions needed in determining when there is actuation of capacitive sensors, e.g., by pressing and deflecting a target key that changes the capacitance value of an associated capacitive sensor. The capacitive touch AFE 104 measures the capacitance value of each sensor of the matrix of capacitive sensor keys 102 and converts the capacitance values into respective analog direct current (DC) voltages that are read and converted into digital values with an analog-to-digital converter (ADC) (not shown) and read by the digital processor 106.

The ADC controller 110 may control the capacitive touch AFE 104, switches for charging and discharging the capacitance touch sensors of the keys 102, timing of the steps required in determining capacitance values, sampling and conversion of the charge voltage on a sample and hold capacitor of an analog-to-digital converter (ADC), etc. The ADC controller 110 may be programmable and its programmable parameters stored in registers (not shown).

The digital processor 106 may supply clock and control request functions to the ADC controller 110, read the digital output from the ADC, and select each key of the matrix of capacitive sensor keys 102. When actuation of a key of the matrix of capacitive sensor keys 102 is determined, the digital processor 106 will take an appropriate action. More detailed descriptions of various capacitive touch systems are more fully disclosed in Microchip Technology Incorporated application notes AN1298, AN1325 and AN1334, available at www.microchip.com, and are hereby incorporated by reference herein for all purposes.

Turning now to FIG. 2, a high-level block diagram illustrating an ADC circuit according to embodiments is shown. The circuit 200 includes an ADC core 202 including a sample and hold capacitor 203. Sample and hold pull up/down switches 204 operate to charge/discharge an analog bus 205, as will be explained in greater detail below. When the switches are open, the circuit acts as a traditional ADC. The switches allow the CVD sequencer to pre-charge the ADC sample and hold capacitor 203 to Vdd or Vss.

Additional sample and hold capacitors 208 couple to the bus and are programmably operable for setting a total sample and hold capacitance for maximum resolution. The circuit 200 may further include port logic 212 coupled to nodes 211, which receive inputs from sensor capacitors 210. In addition, logic 214 may provide a direct analog connection to a node (pin) 213 to override port logic 212.

Figure 3A:
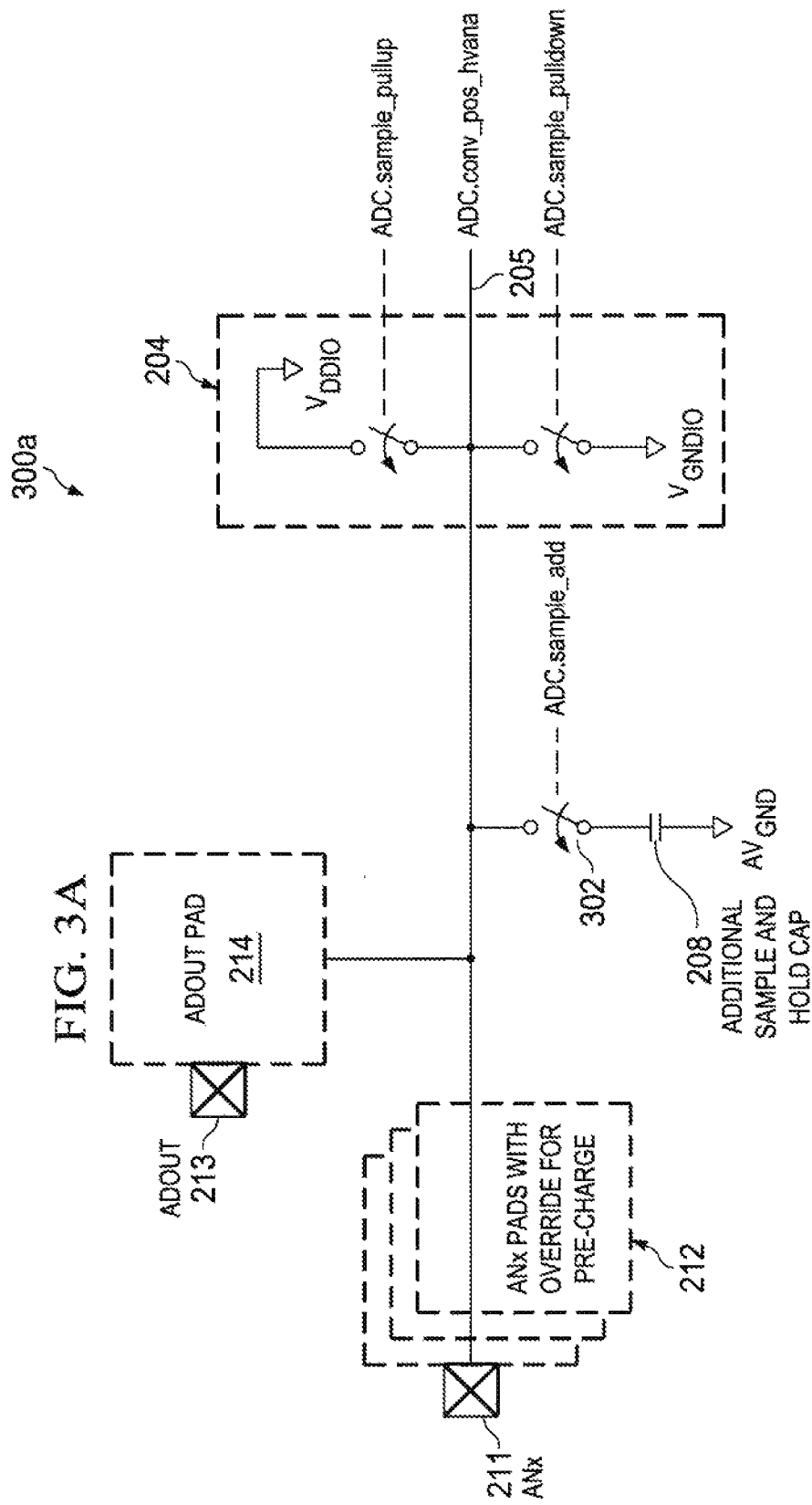
FIGS. 3A and 3B show various switches used according to various embodiments.
Figure 3B:
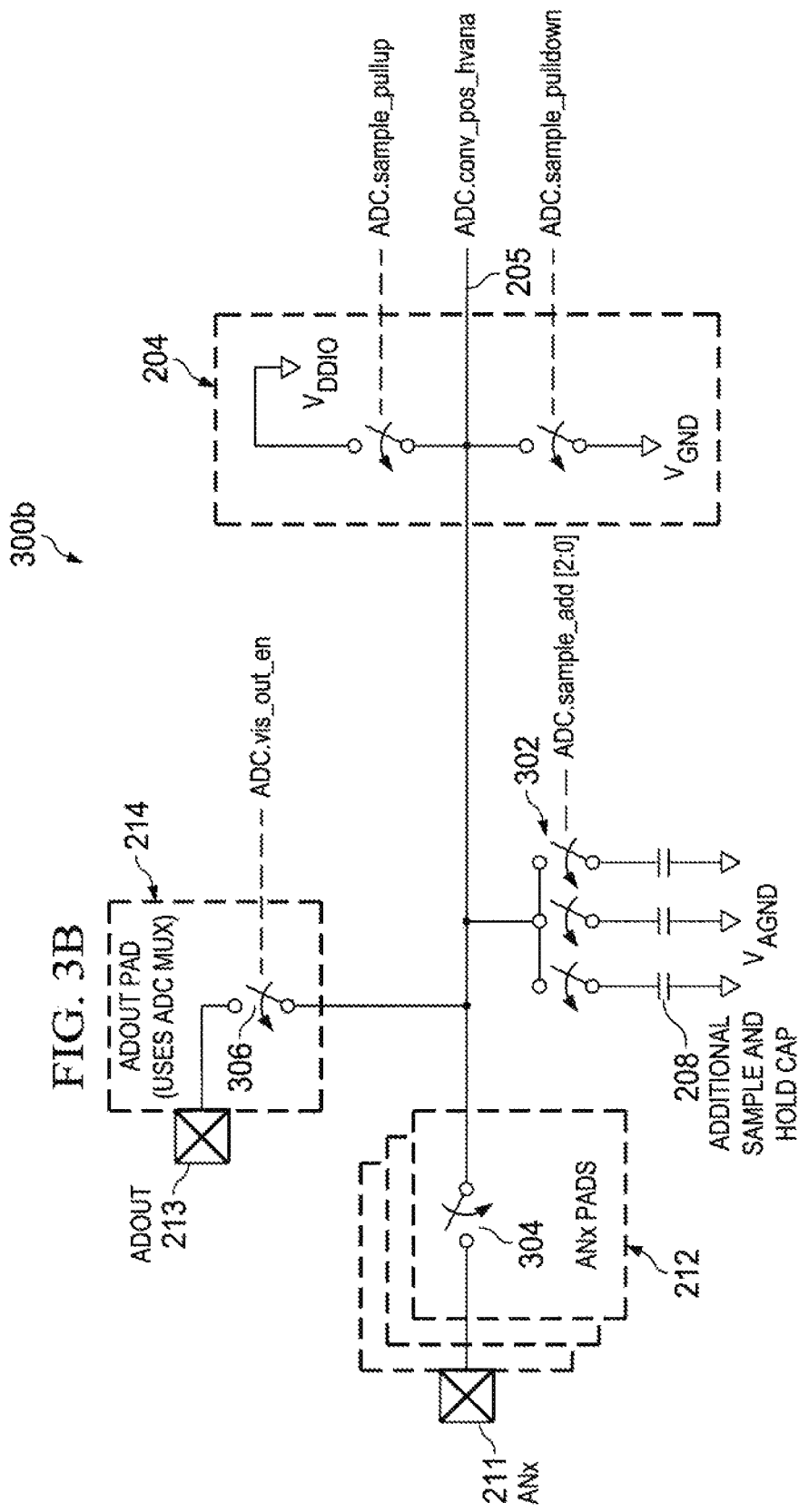

FIGS. 3A and 3B show a bank of adjustable ADC sample-and-hold capacitor(s) 208 in greater detail. During the course of a CVD (capacitive voltage division) conversion, the internal sample-and-hold capacitance 203 (FIG. 2) is charged. At the same time, the sensor capacitor 210 (FIG. 2) is discharged. When the two capacitances are connected, they divide the charge in the sample-and-hold capacitor.

More particularly, as shown in FIG. 3A, which depicts a schematic block diagram of analog and digital connection configurations 300a, a plurality of nodes 211 may be coupled to and from an analog bus 205, e.g., selection of each of a plurality of capacitive touch sensors. A direct connection may couple together the node 213 and the analog bus 205. A switch 302 may couple and decouple additional sample and hold capacitor 208 to and from the analog bus 205. The pull up/down switches 204 may be used to charge the analog bus 205 to Vdd, and discharge the analog bus 205 to Vss.

Referring to FIG. 3B, depicted is a schematic block diagram of analog and digital connection configurations 300b, according to another embodiment. A plurality of analog pass gate switches 304 may implement an analog multiplexer and couple and decouple a plurality of nodes 211 to and from analog bus 205, e.g., selection of each of a plurality of capacitive touch sensors. Either a direct connection couples together the node 213 and the analog bus 205, or an optional analog pass gate switch 306 may couple and decouple the node 213 to and from the analog bus 205. The additional pass gate switch 306 can be part of the analog multiplexer if the multiplexer is designed to allow more than one switch to be closed. A plurality of switches 302 may couple and decouple additional sample and hold capacitors 208 to and from the analog bus 205. The pull up/down switches 204 may be used to charge the analog bus 205 to Vdd, and discharge the analog bus 205 to Vss.

As noted above, the number and capacitance value(s) of the additional sample and hold capacitors 208 may be programmed into one or more registers of the ADC controller 110, for example, during manufacturing or by a programmer in response to a calibration phase. During the calibration phase, the external sensor capacitance of each capacitive sensor connected to the microcontroller can be determined and stored in a calibration table. This table may then be used to adjust the additional capacitances of the sample & hold capacitors when the respective port connected to the external sensor is coupled with the ADC unit for measurement. The additional sample and hold capacitances 208 are then used in conjunction with the standard sample and hold capacitor for CVD conversion, as will be explained in greater detail below.

Figure 4A:
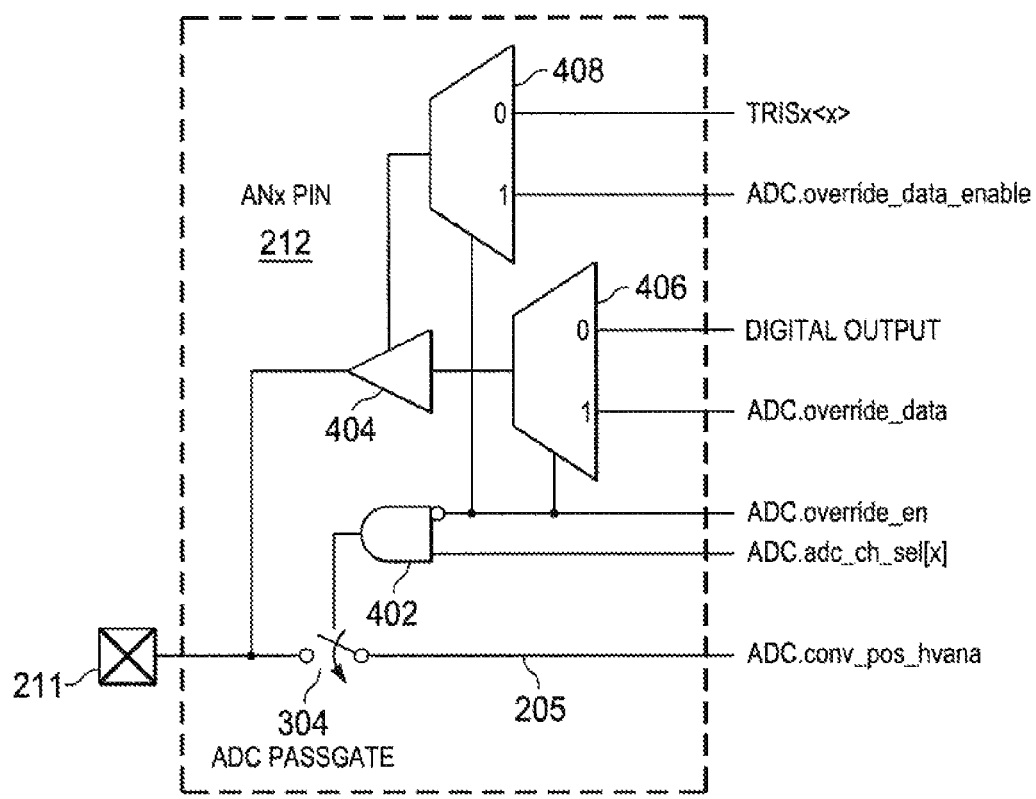

Referring to FIG. 4A, depicted is a schematic block diagram of multi-function port logic 212 that supports a digital I/O and an analog function via an analog pass gate switch wherein in addition the analog function can be overridden to precharge and discharge a capacitive touch sensor connected to the port with ADC controller logic, as will be discussed in greater detail below. Such a port logic may be used for any of the external pins 211 and when the analog multiplexer is configured to allow more than one switch to be closed then also for pin 211. Switching between digital and analog functions at the node 211 can be processor intensive and may require a complex program to properly handle all related digital and analog functions required of the node 211, as more fully described below. In order to take the load, e.g., program steps and/or control functions, off of the processor 106 during setup and determination, of the capacitance value of each capacitive sensor, an ADC override feature may be incorporated into the capacitive touch determination circuits described herein.

Use of a dedicated ADC controller incorporating the circuit functions shown in FIG. 4A will save digital processor program steps and allow for the processor to perform other functions during determination of the capacitive sensor capacitance. However, according to other embodiments, the override function can also be omitted.

Returning to FIG. 4A, a digital driver 404 having a tri-state output is coupled to the external node 211 and is controlled by a tri-state control signal from a multiplexer 408. A digital output signal from a multiplexer 408 is coupled to an input of the digital driver 404. An analog pass gate switch 304 is controlled by analog switch logic 402. When the ADC override enable signal is at a logic low the multiplexer 408 couples the tri-state control signal to control the tri-state output of the digital driver 404, and the multiplexer 406 couples the digital output signal to the input of the digital driver 404. The ADC channel select (analog bus control) controls the analog pass gate switch 304 to directly couple the node 211 to the analog bus 205, as more fully described below.

However, when the ADC override enable signal is at a logic high, the multiplexer 408 couples the ADC override data enable signal to control the tri-state output of the digital driver 404, and the multiplexer 406 couples the ADC override data signal to the input of the digital driver 404. The analog pass gate switch 304 is forced to decouple the analog bus 205 from the node 211. In this configuration, the ADC override data enable and ADC override data signals may be provided by an ADC logic controller (not shown), and may be used to charge or discharge a capacitive touch sensor coupled to the node 211 without requiring program intensive actions from the digital processor 106.

Also, according to yet other embodiments, the port logic as shown may be used to create a universal port logic for each external pin, as for example, shown in FIG. 4B. Thus, a universal port logic for all external pins may have two pass gates 304a, 304b which can be controlled independently to connect to the analog bus 205 or may have a single pass gate which is part of the analog multiplexer that allows to be controlled by an independent enable signal. More particularly, as shown in FIG. 4B, additional logic 420, 426, 428 is provided to select for operation of pass gate 304a, 304b to bypass port logic.

As noted above, and as will be discussed in greater detail below, a CVD conversion according to embodiments may implement a pre-charge phase and a sharing/acquisition phase prior to a conversion phase. During pre-charge, internal and external capacitors are charged and discharged; during sharing/acquisition, external and internal capacitors share a charge. The functionality implemented by the sequencer is illustrated more particularly with reference to FIG. 5-7.

Figure 5:
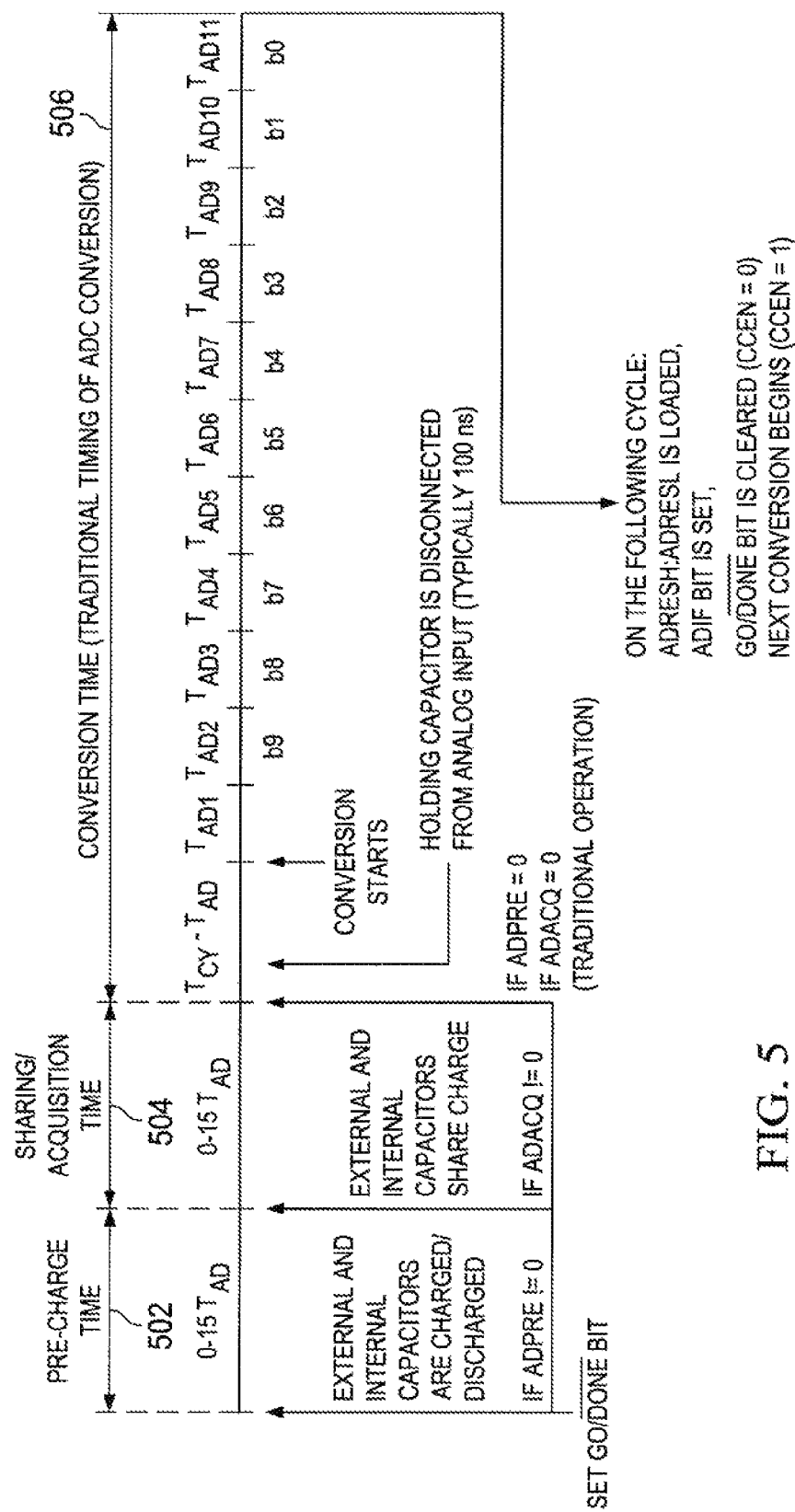
FIG. 5 shows an exemplary timing of an automated analog-to digital conversion according to various embodiments.
Figure 6:
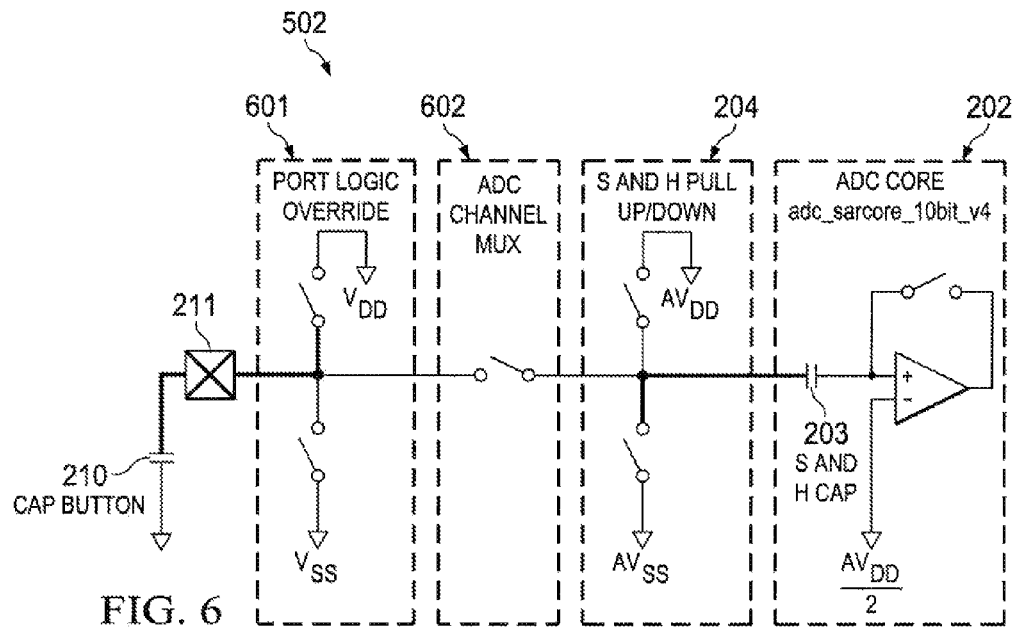
FIG. 6 shows switch positions during the pre-charge phase.

FIG. 5 illustrates exemplary timing for the pre-charge and sharing/acquisition phases. In particular, in some embodiments, the pre-charge phase 502 is an optional 1-127 instruction cycle time used to put the external channel 210 and internal sample and hold capacitor 203 into preconditioned states. During this phase (FIG. 6), the sample and hold capacitor 203 is shorted to either Vdd or Vss (depending on pull up/down circuitry 204), the port pin logic 601 is overridden, and the analog multiplexer 602 is forced open.

Figure 7:
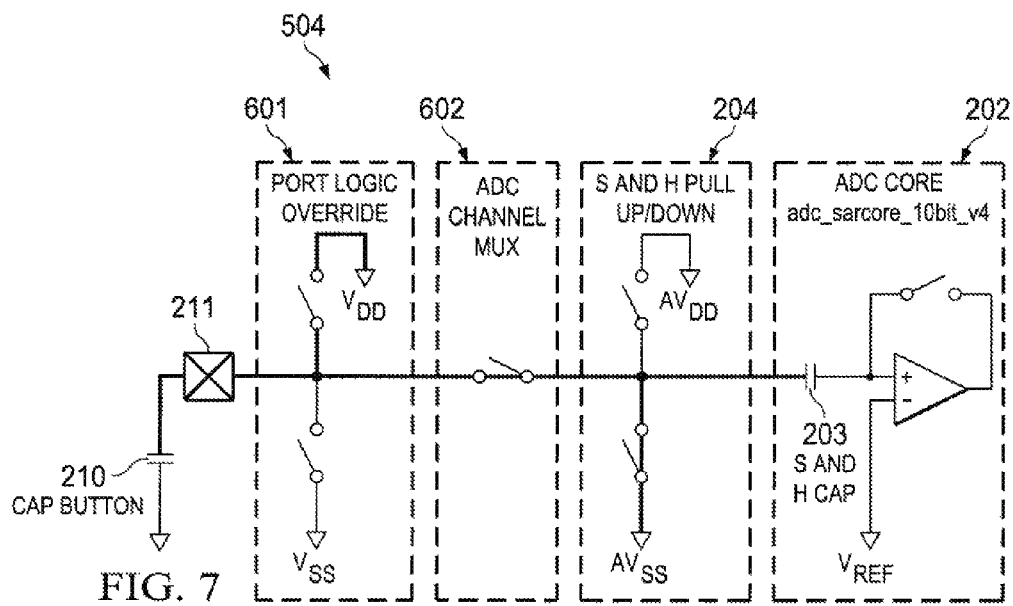
FIG. 7 shows switch positions during the acquisition/share phase.

Returning to FIG. 5, the sharing/acquisition time 504 according to some embodiments is also an optional 1-127 instruction cycle time used to allow the voltage on the internal sample and hold capacitor 203 to charge or discharged from the selected analog channel. At the start of the acquisition stage 504, as shown in FIG. 7, the selected ADC channel is connected to the sample and hold capacitor 203 with multiplexer 602. If the previous stage was the pre-charge stage, the time allows charge sharing between an external channel and the sample and hold capacitor.

Figure 8:
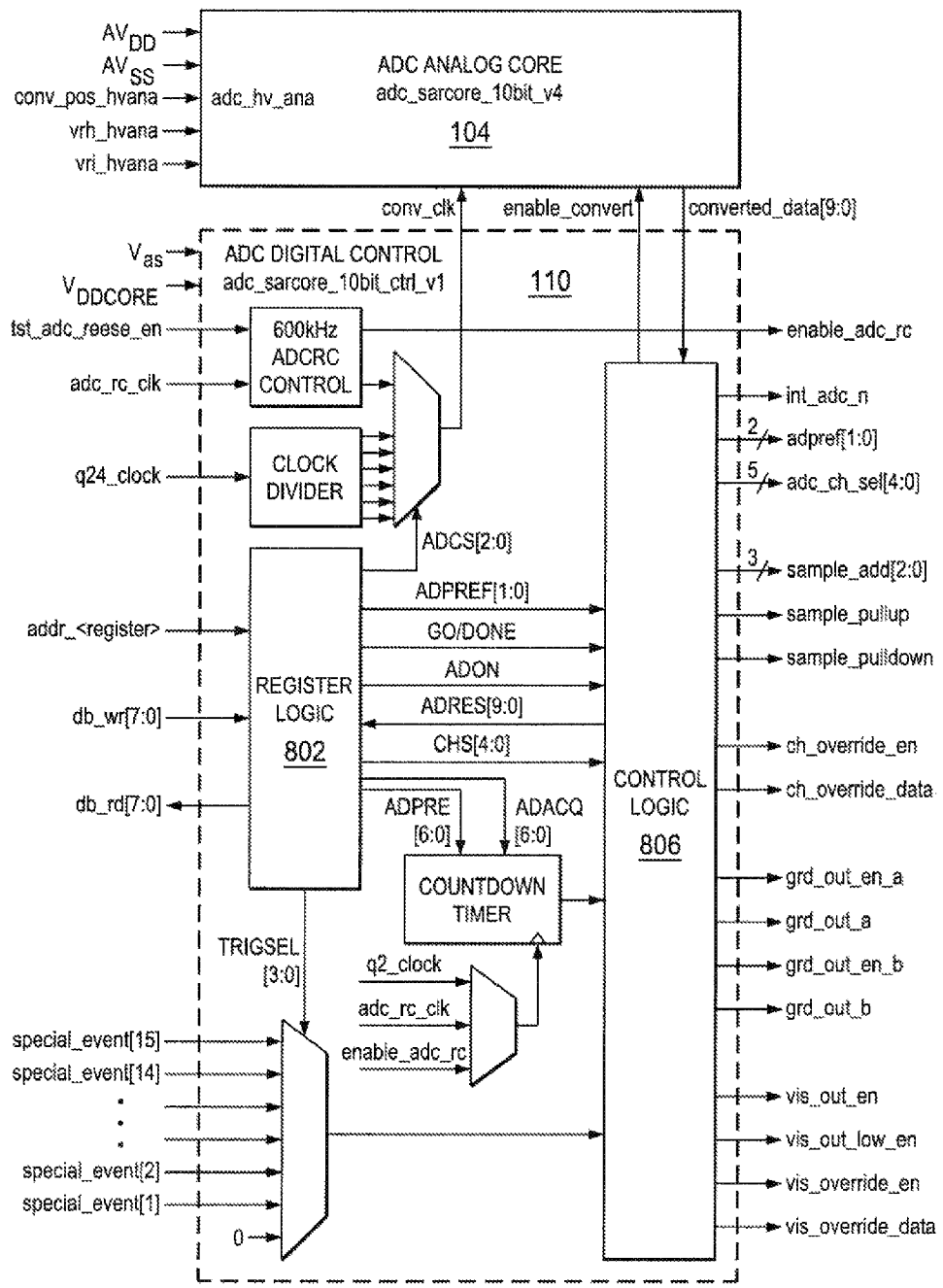
FIG. 8 shows a block diagram of an ADC module according to an embodiment.

Referring now to FIG. 8, a diagram illustrating an exemplary ADC module in accordance with embodiments is shown. The module includes a digital control 110 and analog front end 104. The controller 110 includes register logic 802 and control logic 806. The register logic 802 may be programmed with a variety of controls, including controls for the switches that control the additional capacitances 206.

Exemplary capacitive sensor keys suitable for use in embodiments as described are shown in FIG. 21 and FIG. 22.

Referring now to FIG. 21, depicted is a schematic elevational view of capacitive sensor keys shown in FIG. 1. A substrate 2004, e.g., printed circuit board (PCB), may have a ground plane 2006 that may be used for electromagnetic interference (EMI) shielding. Capacitive sensor plates 2008 may be transposed on a face of the substrate 2004 and in proximity to the ground plane 2006. Other circuit conductors 2010 (e.g., PCB traces) may also be in close proximity to the capacitive sensor plates 2008. Touch targets 212 lay over respective ones of the capacitive sensor plates 2008 and may have an air gap 2014 therebetween. Coverings 2016 may be placed over or be part of the touch targets 2012 and may have alpha-numerical information engraved thereon. Each of the capacitive touch keys 108 comprises a sensor plate 2008, touch target 2012 and covering 2016. Dielectric spacers 2018 are located between each of the capacitive touch keys 108.

The ground plane 2006 and/or circuit conductors 2010 may be at different voltage potentials then the capacitive sensor plates 2008. This can create parasitic capacitance between the capacitive sensor plate 2008 and portions of the ground plane 2006 and/or circuit conductors 2010 in close proximity to the capacitive sensor plate 2008.

Referring to FIG. 22, depicted is a schematic elevational view of capacitive sensor keys shown in FIG. 1 and having capacitive guard rings around each of the capacitive sensors, according to a specific example embodiment of this disclosure. A guard ring 3020 around each of the capacitive sensor plates 2008 is added to the capacitive sensor keys 102a.

Figure 20:
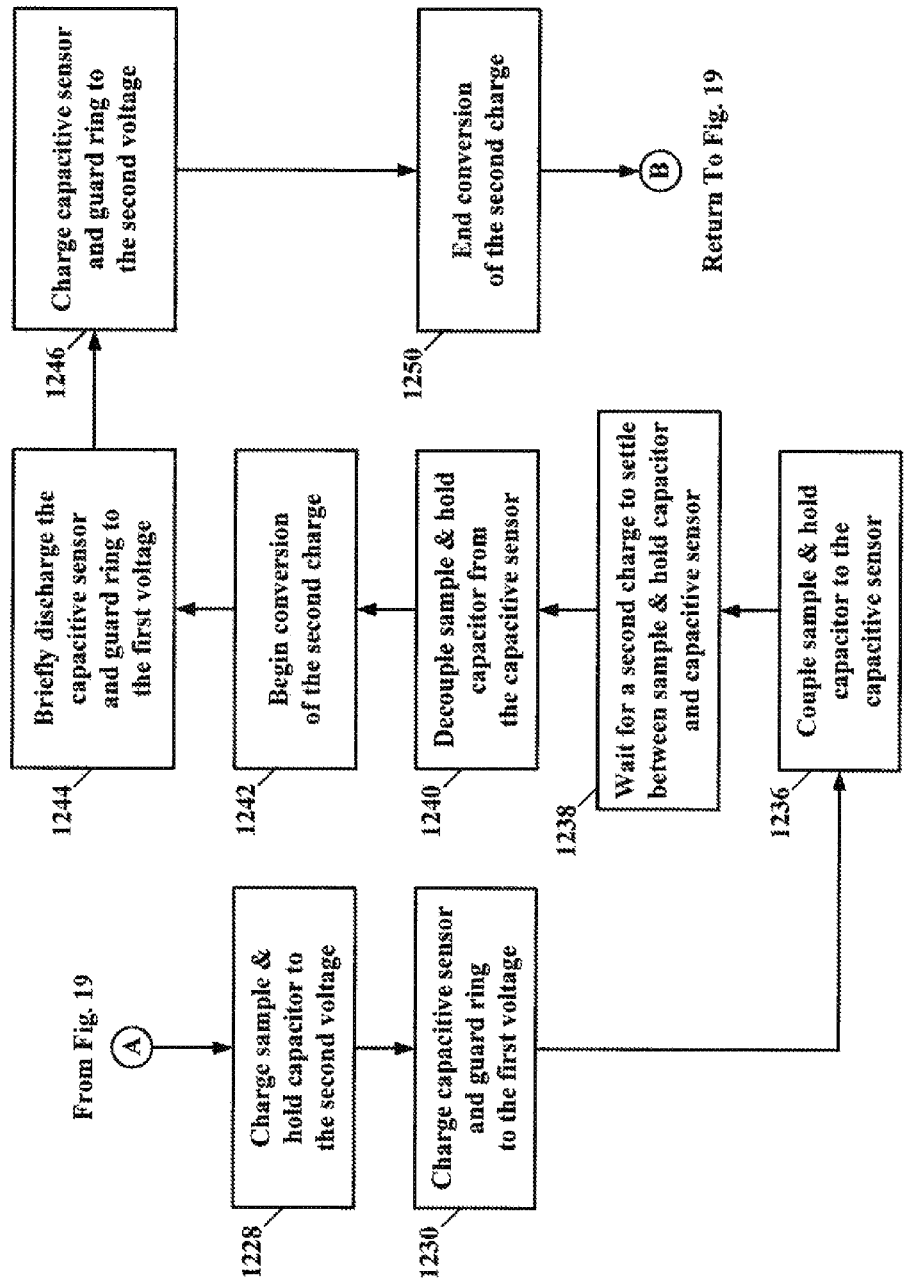

Otherwise all other elements are substantially the same as the capacitive sensor keys 102 shown in FIG. 20. By maintaining a voltage on the guard rings 3020 that is substantially the same as the voltage on the respective capacitive sensor plate 2008, parasitic capacitances are significantly reduced. Thereby increasing detection resolution of a change in the capacitance value of the capacitor sensor plate 2008 occurring during a touch thereto. In addition, providing for enhanced noise shielding does not affect the detection resolution as it would in the configuration shown in FIG. 20. In such an embodiment, there is substantially no parasitic capacitance between the capacitive sensor plate 208 and the guard ring 320 because both are at substantially the same voltage potential.

Figure 9:
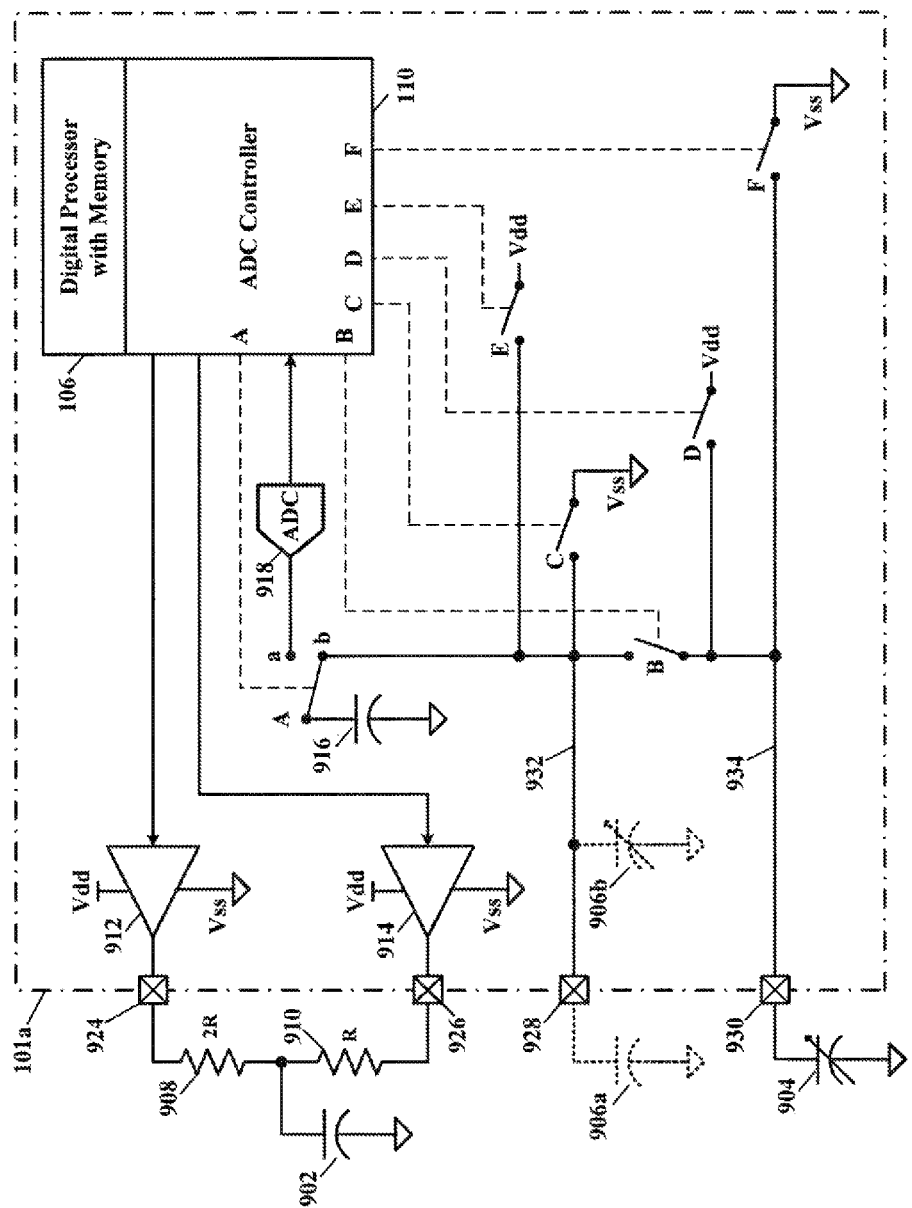
FIG. 9 illustrates a schematic diagram of a mixed signal integrated circuit device having CVD processing capabilities for a capacitive sensor and associated guard ring, according to a specific example embodiment of this disclosure.

Referring to FIG. 9, depicted is a schematic diagram of a mixed signal integrated circuit device having CVD processing capabilities for a capacitive sensor and an associated guard ring, according to a specific example embodiment of this disclosure. The mixed signal integrated circuit device 101 shown in FIG. 9, e.g., a microcontroller, is applicable when using the capacitive voltage divider (CVD) method of determining the capacitance value of the capacitive sensor plate 2008. By first determining the capacitance value of an untouched capacitive sensor plate 2008 and then determining a subsequent capacitance value of a touched capacitive sensor plate 2008, a touch to that capacitive sensor plate 2008 may be determined based upon the change in capacitance thereof. In CVD two capacitors are charged/discharged to opposite voltage values. Then the two oppositely charged capacitors are coupled together and a resulting voltage is measured on the connected two capacitors. A more detailed explanation of CVD is presented in commonly owned United States Patent Application Publication No. US 2010/0181180, incorporated by reference herein for all purposes. The switches shown in FIG. 9 may be, for example but are not limited to, field effect transistor (FET) switches. The nodes 928 and 930 are analog nodes coupled to respective internal single line (conductor) analog buses 932 and 934, respectively.

The capacitance of the capacitive sensor plate 2008 is represented by variable capacitor 904 (first CVD capacitor), and the second CVD capacitor may be the sample and hold capacitor 916 if these two capacitors have fairly close capacitive values e.g., 1:1 to about 3:1. The reason for this in CVD is that part of the charge from one capacitor is transferred to the other capacitor having no charge or an opposite charge. For example, when the two CVD capacitors are equal in value, half of the charge on one will be transferred to the other capacitor. A two to once capacitance ratio will result in ⅓ of the charge being transferred to or taken from the smaller (½C) capacitor depending upon which of one the capacitors was initially charged. When the sample and hold capacitor 916 is substantially smaller than the capacitive sensor capacitor 904, additional capacitance 906a may be added externally to node 928, and/or internal capacitance 906b may be added independently of node 928 so that the combined capacitance of the capacitors 916, 906a and/or 906b have sufficient capacitance in relation to the capacitance value of the capacitive sensor capacitance 904 to meet the criteria above. This results in the best resolution in determining a capacitance value using CVD. Capacitor 916 is also the sample and hold capacitor used to sample and hold the analog voltage resulting after charge is transferred between the two CVD capacitors. Once the charge transfer is complete, an analog-to-digital converter (ADC) 918 converts the resulting charge voltage to a digital value that is read by the ADC controller 110/digital processor 106 for further processing and determination of the capacitance value of the touch sensor capacitor 904.

In the example hereinafter presented, the capacitance values for the capacitor 904 (first CVD capacitor), capacitor 906a (an externally connected capacitor) and/or capacitor 906b (an internally connected capacitor) may be selected in combination with the sample and hold capacitor 916 to result in a combined charge voltage of ⅓ or ⅔ of the Vdd voltage depending on whether the first CVD capacitor 904 is discharged to Vss or charged to Vdd, and the combination of capacitors 906 and 916 are charged to Vdd or discharged to Vss, respectively. In this example, the capacitor 904 is about twice the capacitance as the capacitance of the parallel connected combination of capacitors 906 and 916. The resulting quiescent voltage after coupling the two opposite polarity charged CVD capacitors together will be about ⅓*Vdd when the capacitor 904 was initially discharged to Vss, and about ⅔*Vdd when the capacitor 904 was initially charged to Vdd.

Knowing the expected quiescent voltages of the combination of all capacitors connected in parallel allows creating the appropriate voltages for the guard ring 3020 surrounding the respective sensor plate 208 being evaluated for a capacitance value by the digital processor 106. When Vdd is desired on the guard ring 3020, both outputs from the digital drivers 912 and 914 are at substantially Vdd (logic high). When Vss is desired on the guard ring 3020, both outputs from the digital drivers 912 and 914 are at substantially Vss (logic low). When ⅓*Vdd is desired on the guard ring 3020, the output from the digital driver 914 is at Vss (logic low) and the output from the digital driver 912 is at substantially Vdd (logic high). When ⅔*Vdd is desired on the guard ring 3020, the output from the digital driver 914 is at Vdd (logic high) and the output from the digital driver 912 is at substantially Vss (logic low).

By proper selection of a capacitance value for capacitor 906, and resistance values for resistors 908 and 910, guard ring voltages may easily be generated by the ADC controller 110 using just two digital outputs at nodes 924 and 926. Other voltage ratios may also be effectively used by proper selection of values for capacitor 906 and resistors 908 and 910. For example, if the combined capacitance of capacitors 906 and 916 are substantially equal to the capacitance of capacitor 904, the subsequent combined voltage will be ½*Vdd and the resistors 908 and 910 will be substantially the same resistance to produce ½*Vdd on the guard ring capacitance when appropriate.

Figure 10:
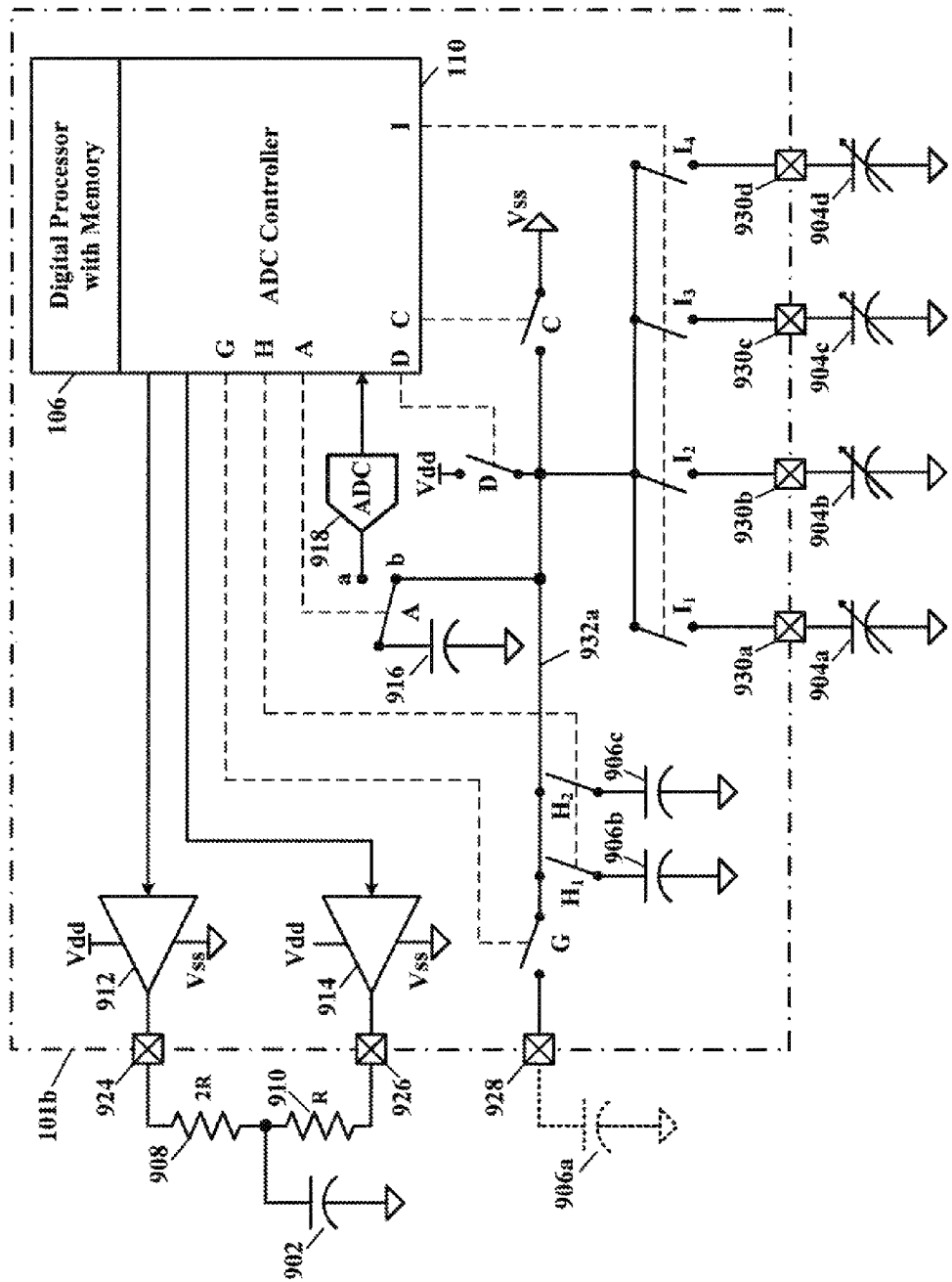
FIG. 10 illustrates a schematic diagram of a mixed signal integrated circuit device having CVD processing capabilities for a plurality of capacitive sensors and a guard ring, according to another specific example embodiment of this disclosure.

Referring to FIG. 10, depicted is a schematic diagram of a mixed signal integrated circuit device having CVD processing capabilities for a plurality of capacitive sensors and a guard ring, according to another specific example embodiment of this disclosure. The mixed signal integrated circuit device 101b shown in FIG. 10, e.g., a microcontroller, operates in substantially the manner as the device 101a shown in FIG. 9 except that there is only one single wire analog bus 932a; wherein internal capacitors 906b and 906c are decoupled from the bus 932a with switches H, and the external node 928 is decoupled from the bus 932a with switch G. Only one set of VddNss switches D and C are used wherein the first CVD capacitor 904 is charged/discharged during a different time period then the second CVD capacitor 916 (and 906) is discharged/charged. This saves a set of switches and a second internal analog bus (see FIG. 9 bus 934).

In addition, a plurality of switches I are used to multiplex each of the capacitive sensors 904 used in the capacitive touch keys 108 shown in FIG. 1. These features may also be incorporated into the circuit of FIG. 9. The analog multiplexer switches I select respective ones of the plurality of sensor capacitors 904 as the capacitive touch analog front end 104 scans the capacitive touch keys 108. The plurality of nodes 930 are typically multi-purpose programmable analog or digital inputs and/or outputs. For explanatory clarity in this disclosure only analog input/output (two way) configured nodes are shown. The digital processor, through the digital drivers 912 and 914, drives nodes 924 and 926 to appropriate logic levels for the selected one of the plurality of sensor capacitors 904.

Figure 11:
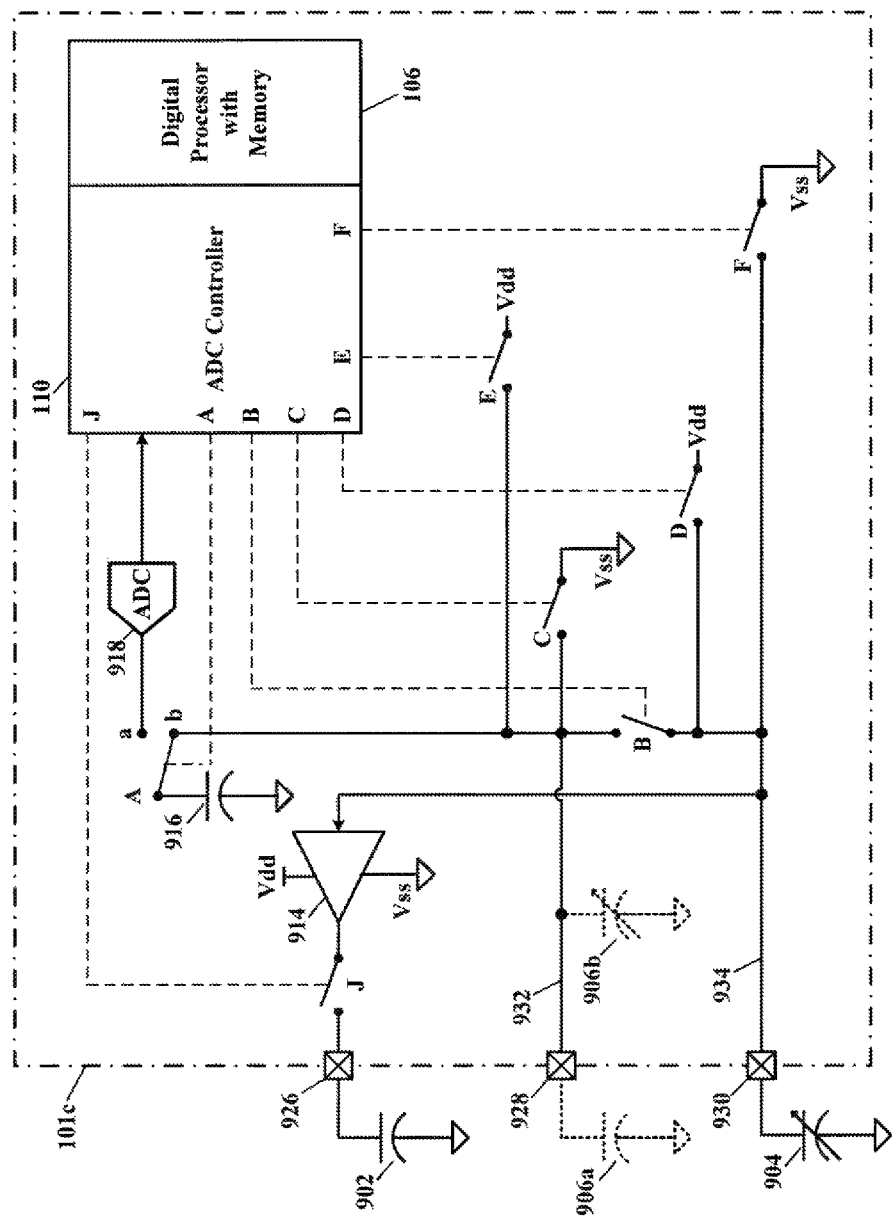
FIG. 11 illustrates a schematic diagram of a mixed signal integrated circuit device having CVD processing capabilities for a capacitive sensor and associated guard ring, according to a specific example embodiment of this disclosure.

Referring to FIG. 11, depicted is a schematic diagram of a mixed signal integrated circuit device having CVD processing capabilities for a capacitive sensor and associated guard ring, according to a specific example embodiment of this disclosure. The mixed signal integrated circuit device 101b shown in FIG. 11, e.g., a microcontroller, operates in substantially the manner as the device 101a shown in FIG. 9.

Optionally, an analog buffer driver 914 having a high input impedance may be coupled to node 930 which is also coupled to the capacitor 904. The analog buffer driver 914 has a low impedance output that may be switchably coupled through switch J to the node 926 that is also coupled to the guard ring capacitance 902. The output voltage of the analog buffer driver 914 faithfully follows the voltage at the input thereto. Therefore, the voltage on the guard ring 3020 substantially follows the voltage on the respective sensor plate 208 being evaluated for a capacitance value by the digital processor 106.

Figure 12:
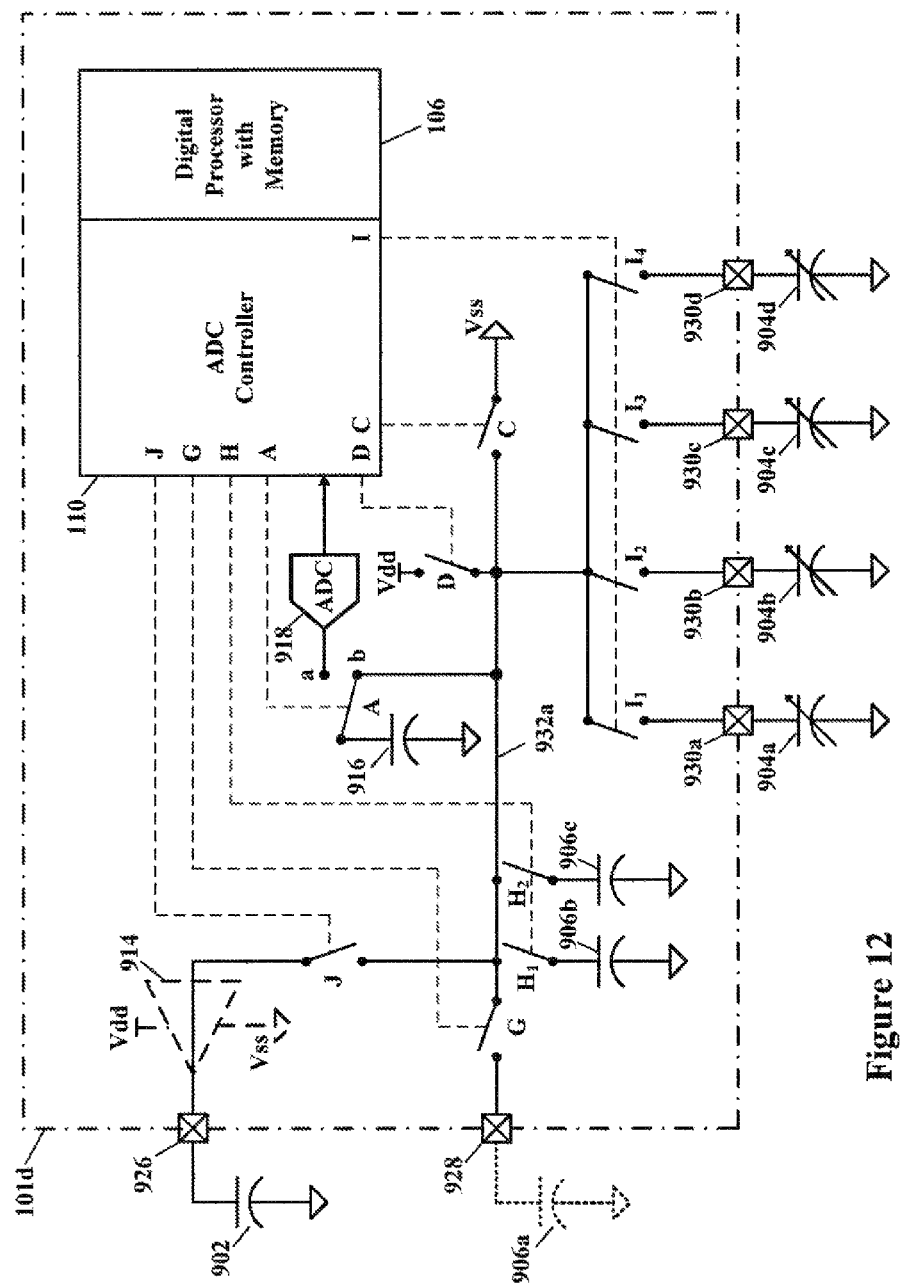
FIG. 12 illustrates a schematic diagram of a mixed signal integrated circuit device having CVD processing capabilities for plurality of capacitive sensors and a guard ring, according to another specific example embodiment of this disclosure.

Referring to FIG. 12, depicted is a schematic diagram of a mixed signal integrated circuit device having CVD processing capabilities for a plurality of capacitive sensors and a guard ring, according to another specific example embodiment of this disclosure. The mixed signal integrated circuit device 101d shown in FIG. 12, e.g., a microcontroller, operates in substantially the manner as the device 101a shown in FIG. 10.

Optionally, an analog buffer driver 914 having a high input impedance may be coupled between the node 926 and the single wire analog bus 932a through switch J when the selected one of the plurality of capacitors 904 is being charged/discharged. The analog buffer driver 914 has a low impedance output coupled to the node 926 which is coupled to the guard ring capacitance 902. The output voltage of the analog buffer driver 914 faithfully follows the voltage on the selected one of the plurality of capacitors 904.

With respect to FIGS. 9 through 12, it is contemplated and within the scope of this disclosure that various embodiments of a microcontroller may include external node 928 to allow for connection of an external capacitor 906a as explained hereinabove. An additional adjustable capacitor(s) 906b (and 906c) may be present internally and may be switchably coupled to the analog bus 932a. However, other embodiments may not provide for such an external node 928. Instead, either capacitance 916 may have the appropriate value or an additional internal capacitance 906b, for example a variable capacitance, is or can be connected to bus 932. Furthermore, as each external node 926, 928, and 930 may be programmable to support multiple functions, additional switches (not shown in FIG. 9) may be used to allow to use nodes 926, 928, and 930 for other functions as noted above.

Figure 13:
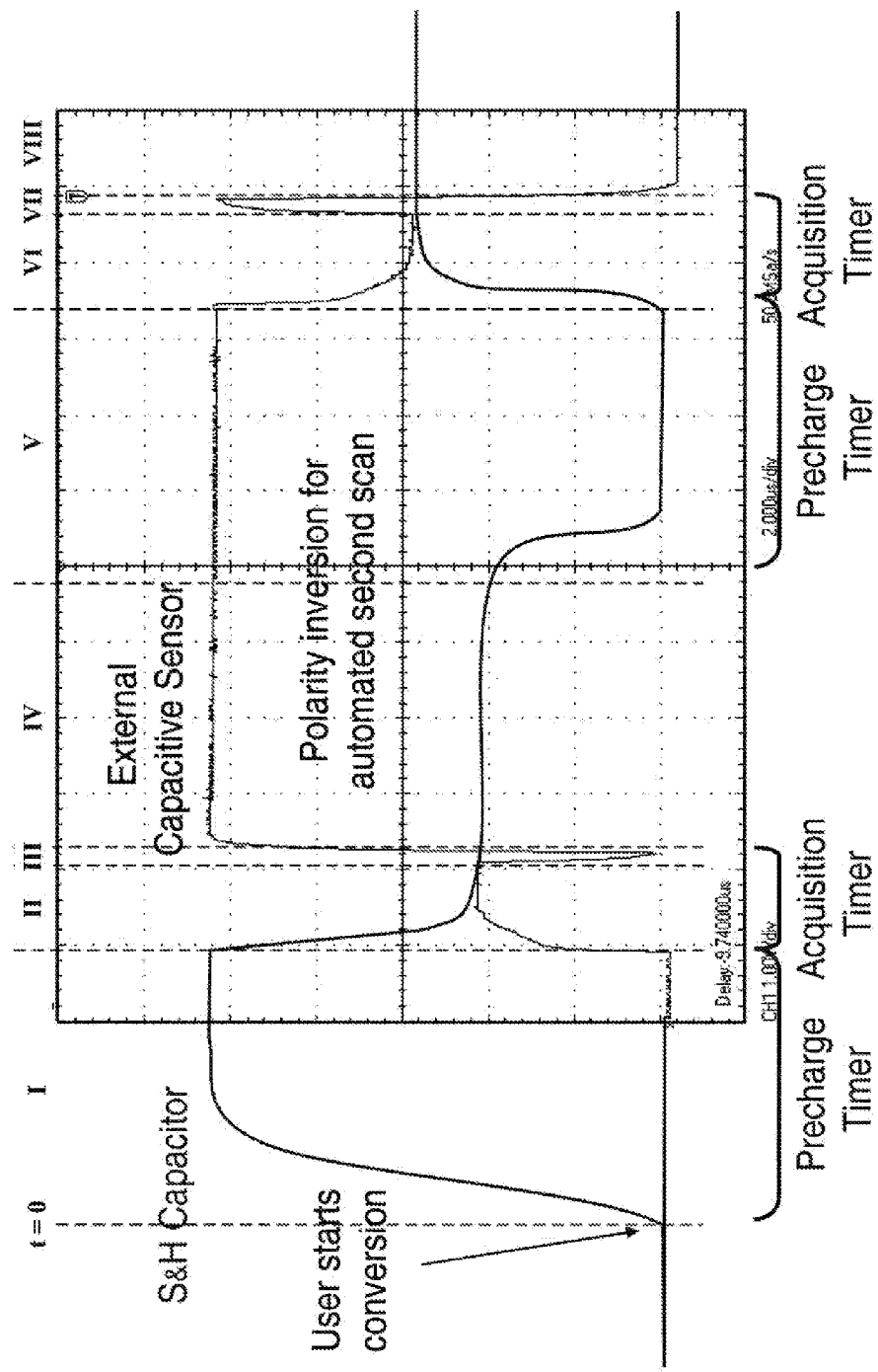
FIG. 13 illustrates a schematic voltage-time diagram of capacitance conversions, according to specific example embodiments of this disclosure.
Figure 14:
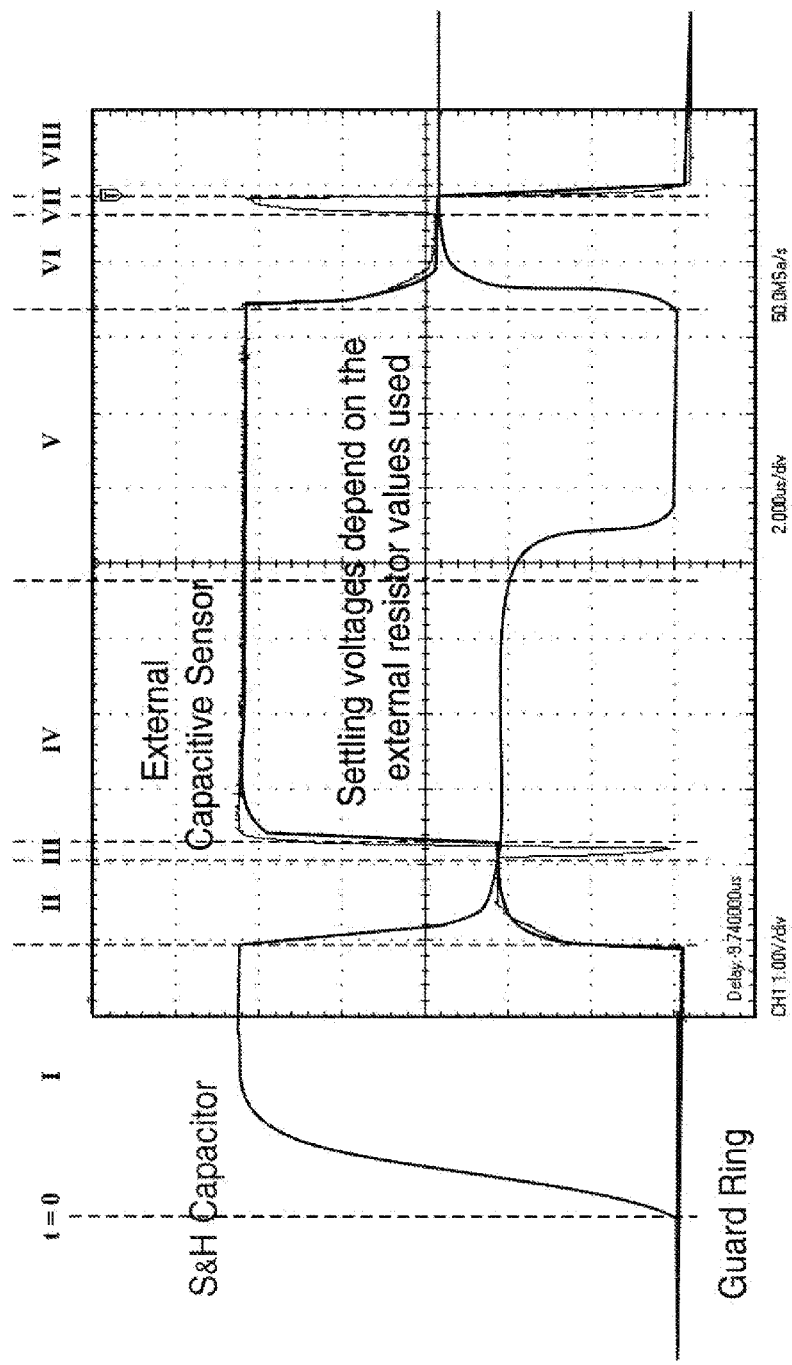
FIG. 14 illustrates a schematic voltage-time diagram of capacitance conversions and guard ring voltage control during these conversions, according to specific example embodiments of this disclosure.

Referring to FIGS. 13 and 14, depicted are schematic voltage-time diagrams of capacitance conversions (FIG. 13), and guard ring voltage control (FIG. 14) during these conversions, according to specific example embodiments of this disclosure. In segment I the capacitors 906 and 916 (sample and hold capacitor) are charged to Vdd, the capacitive sensor capacitor 904 is discharged to Vss, and the guard ring capacitance 902 is discharged to Vss (substantially matching the voltage on the capacitor 904). In segment II the capacitors 906, 916 and 904 are coupled together and a quiescent voltage of about ⅓*Vdd will result when the capacitive touch key 108 is not depressed, and a little less than ⅓*Vdd when depressed. The guard ring capacitance 902 follows the voltage on the capacitor 904 (capacitive sensor) so as to minimize any parasitic capacitances therebetween. Toward the end of segment II the sample and hold capacitor 916 decouples from the capacitors 906 and 904 and retains the quiescent voltage obtained during segment II. In segment III any voltage charge on the capacitor 904 (capacitive sensor) is discharged to substantially Vss, then at the beginning of segment IV the capacitor 904 (capacitive sensor) and the guard ring capacitance 902 are charged to substantially Vdd. Meantime also in segment IV the quiescent voltage stored on the sample and hold capacitor 916 is converted by the ADC 918 to a digital value representing the quiescent voltage and read by the digital processor 106. The digital value from the ADC 918 is used in determining whether the capacitive sensor was being actuated (touched), e.g., quiescent voltage lower then what is expected from a non-actuated touch sensor or not. When the capacitive value of the touch sensor capacitor 904 is actuated (touched) its capacitance increases and the subsequent quiescent voltage will thereby be less then when not actuated. This is true when the capacitor 904 is initialized to Vss. When the capacitor 904 is initialized to Vdd, the subsequent quiescent voltage is about ⅔*Vdd when the capacitive sensor is not actuated.

In segment V the capacitors 906 and 916 (sample and hold capacitor) are discharged to Vss, the capacitive sensor capacitor 904 and guard ring capacitance 902 have already been charged to Vdd. In segment VI the capacitors 906, 916 and 904 are coupled together and a quiescent voltage of about ⅔*Vdd will result when the capacitive touch key 108 is not depressed, and a little more than ⅔*Vdd when depressed. The guard ring capacitance 902 follows the voltage on the capacitor 904 (capacitive sensor) so as to minimize any parasitic capacitances therebetween. Toward the end of segment VI the sample and hold capacitor 916 decouples from the capacitors 906 and 904 and retains the quiescent voltage obtained during segment VI. In segment VII the capacitor 904 (capacitive sensor) is charged to substantially Vdd, then at the beginning of segment VIII the capacitor 904 (capacitive sensor) and the guard ring capacitance 902 are discharged to substantially Vss. Meantime also in segment VIII the quiescent voltage stored on the sample and hold capacitor 916 is converted by the ADC 918 to a digital value representing the quiescent voltage and read by the digital processor 106. The digital value from the ADC 918 is used in determining whether the capacitive sensor was being actuated (touched), e.g., quiescent voltage lower than what is expected from a non-actuated touch sensor or not. When the capacitive value of the touch sensor capacitor 904 is actuated (touched) its capacitance increases and the subsequent quiescent voltage will thereby be greater than when not actuated. This is true when the capacitor 904 is initialized to Vdd. When the capacitor 904 is initialized to Vss, the subsequent quiescent voltage is about ⅓*Vdd when the capacitive sensor is not actuated, as described hereinabove. These sequences repeat for each one of the touch keys 108. Also by inverting the voltage charge polarities every other capacitive measurement cycle and averaging the capacitive measurement values, a type of differential operation is achieved that minimizes common mode noise and interference, e.g., 60 Hz power line interference.

It is contemplated and within the scope of this disclosure that the guard ring 3020 may or may not present. Wherein the ADC controller 110 controls timing, switch and driver selections for charging and discharging of the capacitive touch sensor capacitor 904 and the ADC sample and hold capacitor 916 (and 906); coupling the capacitors 904 and 906 together, causing the ADC to sample the resulting charge voltage and convert the sampled charge voltage to a digital value, and notifying the digital processor 106 that the digital value of the sampled charge voltage is available. In addition, the ADC controller 110 may control the timing, switch and driver selections for charging and discharging of the guard ring 3020.

Figure 15:
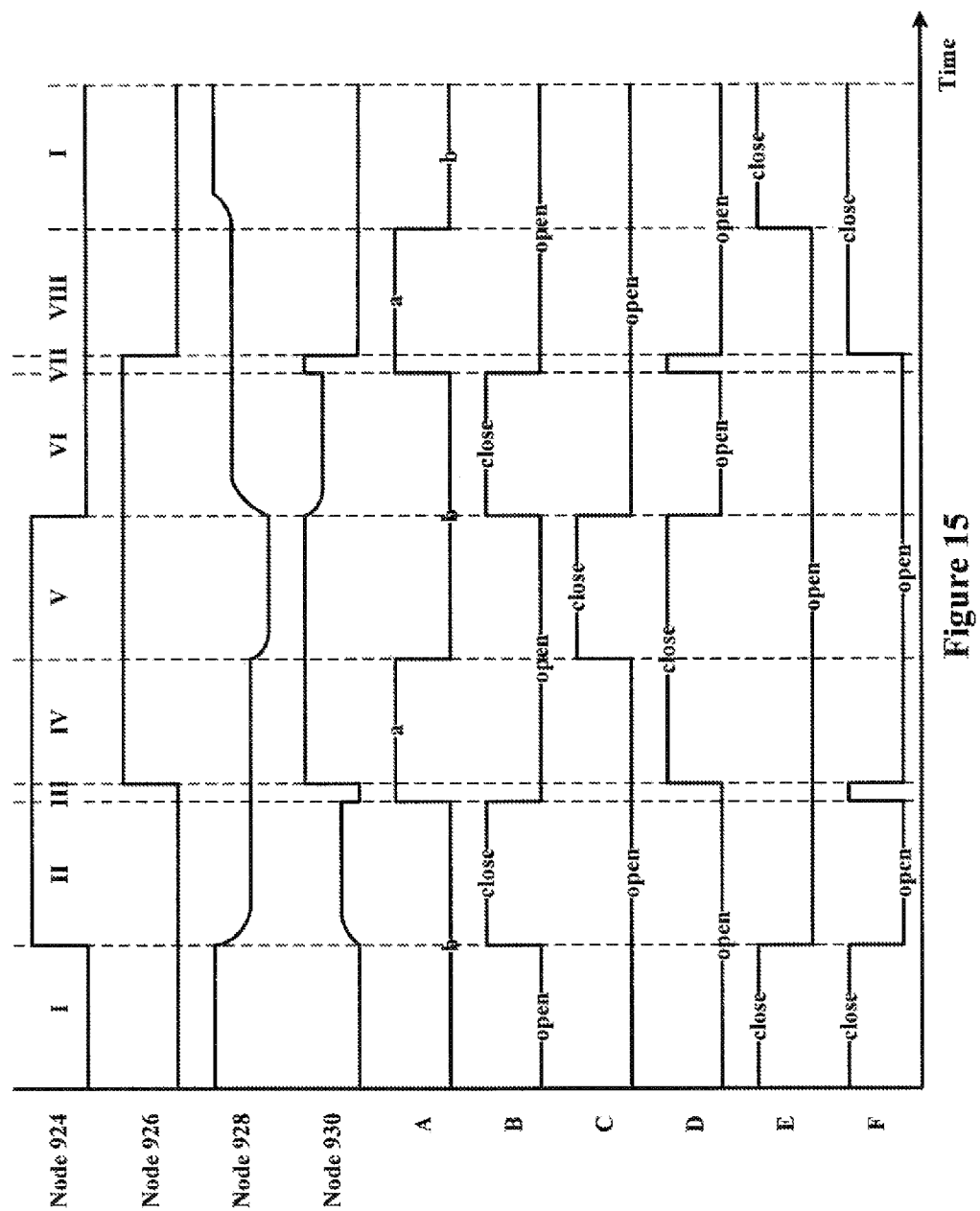
FIG. 15 illustrates a schematic timing diagram of the capacitive conversion system shown in FIG. 7.

Referring to FIG. 15, depicted is a schematic timing diagram of the capacitive conversion system shown in FIG. 9. Voltages on nodes 924, 926, 928 and 930 are shown in relation to the operational open and close combinations of switches A-F. It is contemplated and within the scope of this disclosure that other and further circuit designs and timing diagrams could be used with equal effect, and one having ordinary skill in electronic circuit design and having the benefit of this disclosure could replicate the results described herein.

Figure 16:
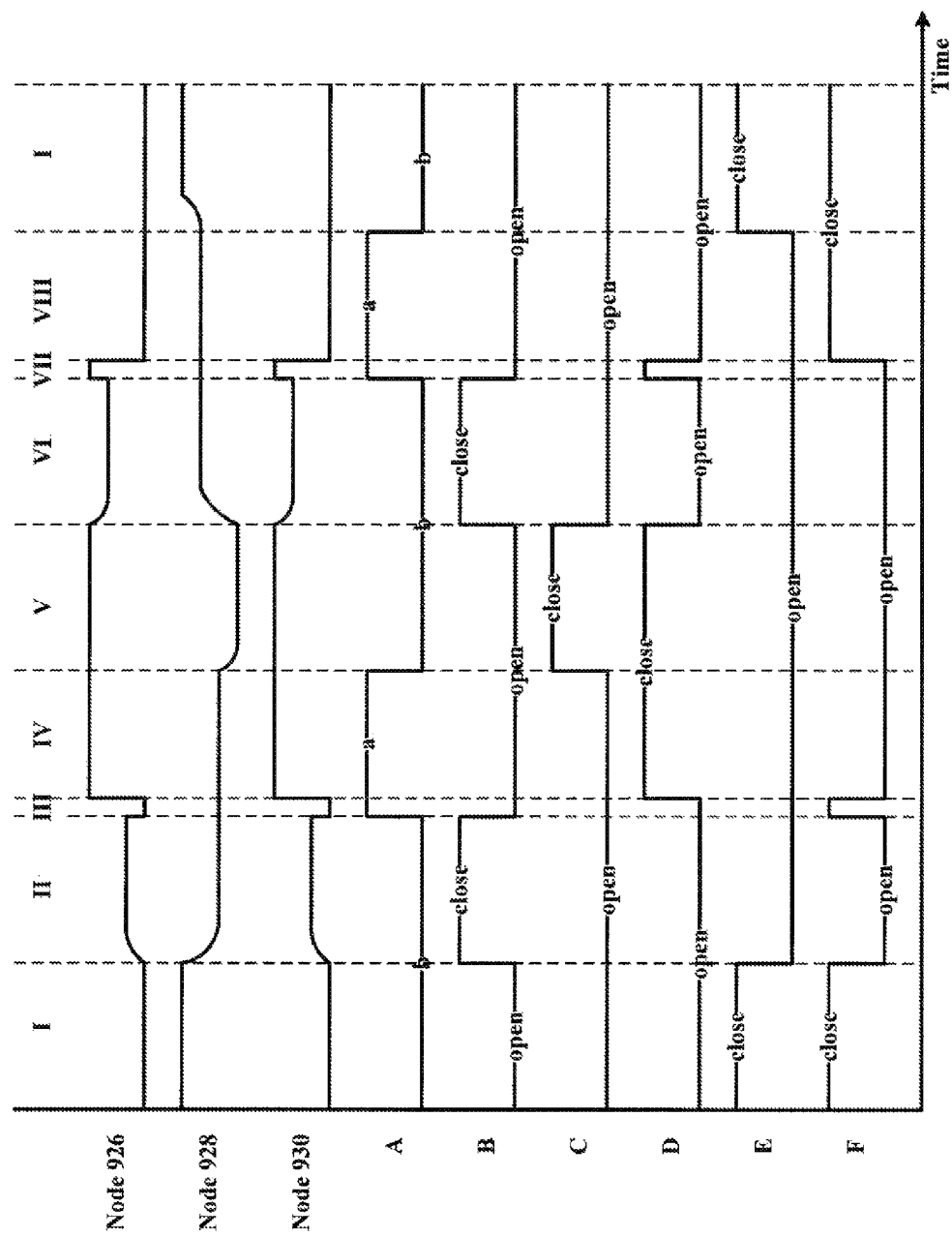
FIG. 16 illustrates a schematic timing diagram of the capacitive conversion system shown in FIGS. 11 and 12.

Referring to FIG. 16, depicted is a schematic timing diagram of the capacitive conversion system shown in FIG. 11. Voltages on nodes 924, 926, 928 and 930 are shown in relation to the operational open and close combinations of switches A-F. FIG. 16 basically represents the same voltage and timing waveforms as shown in FIG. 15. It is contemplated and within the scope of this disclosure that other and further circuit designs and timing diagrams could be used with equal effect, and one having ordinary skill in electronic circuit design and having the benefit of this disclosure could replicate the results described herein.

Figure 17:
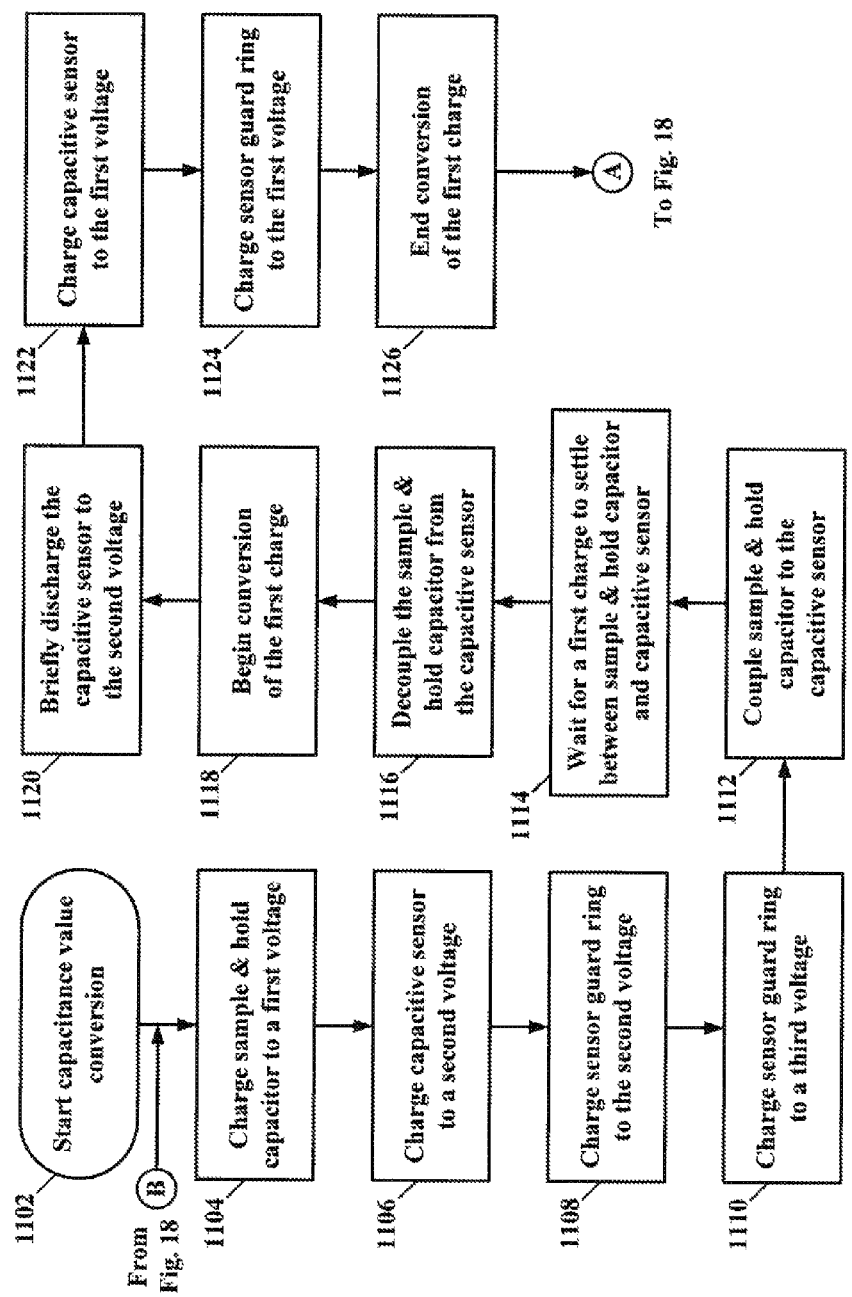
FIGS. 17 and 18 show schematic process flow diagrams of capacitive conversions, according to a specific example embodiment of this disclosure.
Figure 18:
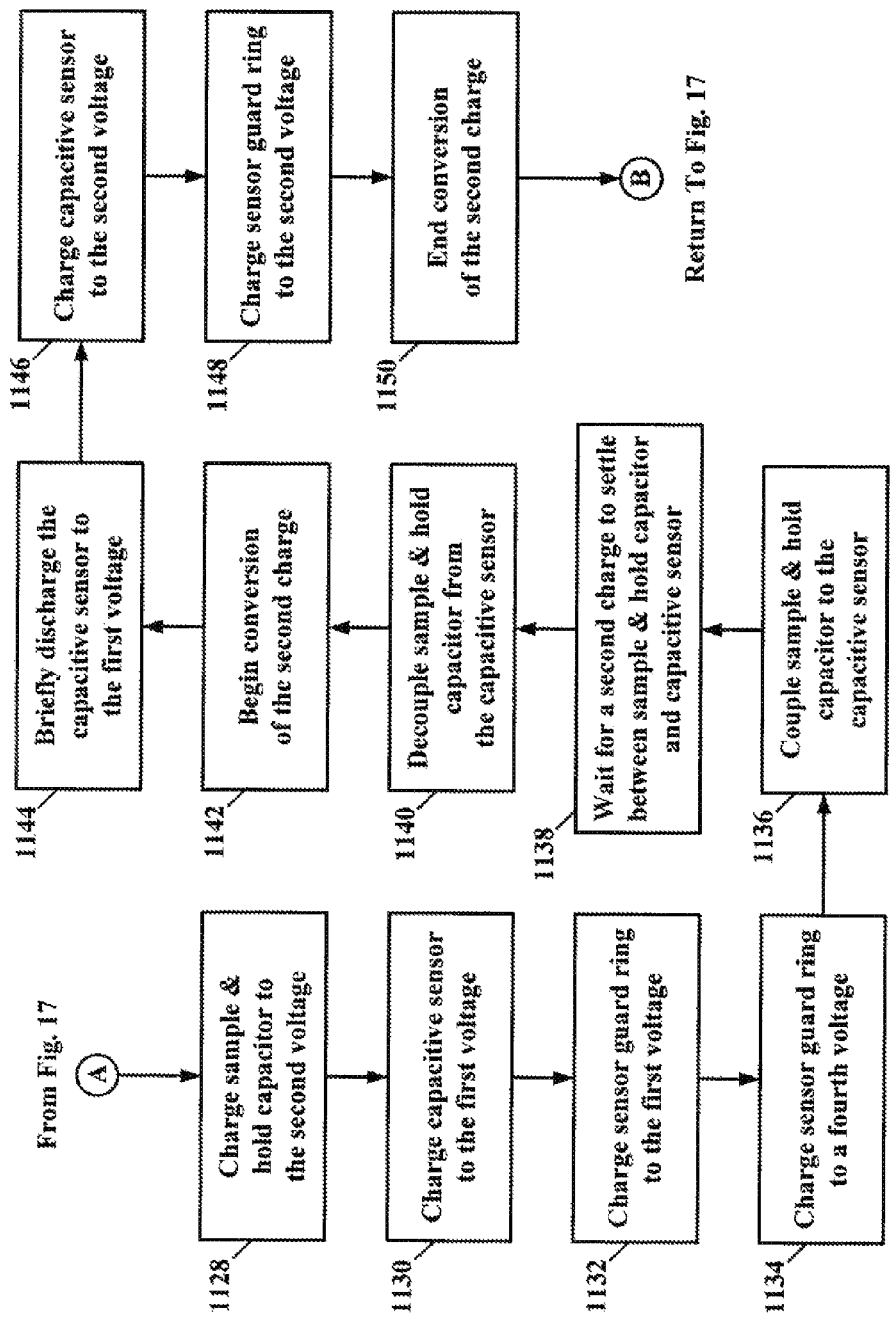

Referring to FIGS. 17 and 18, depicted are schematic process flow diagrams of capacitive conversions, according to a specific example embodiment of this disclosure. The schematic process flow diagrams depicted in FIGS. 17 and 18 represent operation of the mixed signal integrated circuit device having CVD processing capabilities shown in FIGS. 9, 10 and 15. For a first capacitive measurement the following steps may be performed. In step 1102 a capacitance value conversion is started. In step 1104 the sample and hold capacitor combination of the capacitors 906 and 916 are charged to a first voltage. In step 1106 the capacitive sensor is charged to a second voltage. The first voltage may be Vdd and the second voltage may be Vss or visa versa. Optionally, in step 1108 the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors.

Next in step 1110 the sensor guard ring is charged/discharged to a third voltage contemporaneously with execution of step 1112 in which the sample and hold capacitor combination, previously charged to the first voltage, is coupled to the capacitive sensor, previously charged to the second voltage. Steps 1110 and 1112 may be interchanged so long as both occur contemporaneously with each other. In step 1114 the sample and hold capacitor and the capacitive sensor are coupled together long enough in time for a complete settling to a quiescent first charge. Then in step 1116 the sample and hold capacitor is decoupled from the capacitive sensor and the sample and hold capacitor thereafter retains the settled first charge. In step 1118 conversion to a digital representation of the first charge stored in the sample and hold capacitor begins.

In step 1120 the capacitive sensor is briefly discharged to the second voltage. In step 1122 the capacitive sensor is charged to the first voltage. Optionally, in step 1124 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors. In step 1126 the conversion of the first charge to a digital representation thereof terminates and is then read by the digital processor 106 for determining the capacitance value of the capacitive sensor 108.

For an optional second capacitive measurement the following steps may be performed. In step 1128 the sample and hold capacitor combination of the capacitors 906 and 916 are charged to the second voltage. In step 1130 the capacitive sensor is charged to the first voltage. Optionally, in step 1132 the capacitive sensor guard ring is charged to the first voltage so as to minimize parasitic capacitance that would otherwise develop at the capacitive sensor due to electrostatic charge caused by a difference of voltage potential between the capacitive sensor and adjacent conductors.

Optionally, next in step 1134 the sensor guard ring is charged/discharged to a fourth voltage contemporaneously with execution of step 1136 in which the sample and hold capacitor combination, previously charged to the second voltage level, is coupled to the capacitive sensor, previously charged to the first voltage. Steps 1134 and 1136 may be interchanged so long as both occur contemporaneously with each other. In step 1138 the sample and hold capacitor combination and the capacitive sensor are coupled together long enough in time for a complete settling to a quiescent second charge. Then in step 1140 the sample and hold capacitor is decoupled from the capacitive sensor and the sample and hold capacitor thereafter retains the settled second charge). In step 1142 a conversion to a digital representation of the second charge stored in the sample and hold capacitor begins.

In step 1144 the capacitive sensor is briefly discharged to the first voltage. In step 1146 the capacitive sensor is charged to the second voltage. Optionally, in step 1148 the capacitive sensor guard ring is charged to the second voltage so as to minimize parasitic capacitance that would otherwise develop at the capacitive sensor due to electrostatic charge caused by a difference of voltage potential between the capacitive sensor and adjacent conductors. In step 1150 the conversion of the second charge to a digital representation thereof terminates and is then read by the digital processor 106 for determining the capacitance value of the capacitive sensor 108. An advantage of obtaining both first and second charge conversions is that they may be processed to reduce common mode noise and interference, e.g., 60 Hz power line interference.

Figure 19:
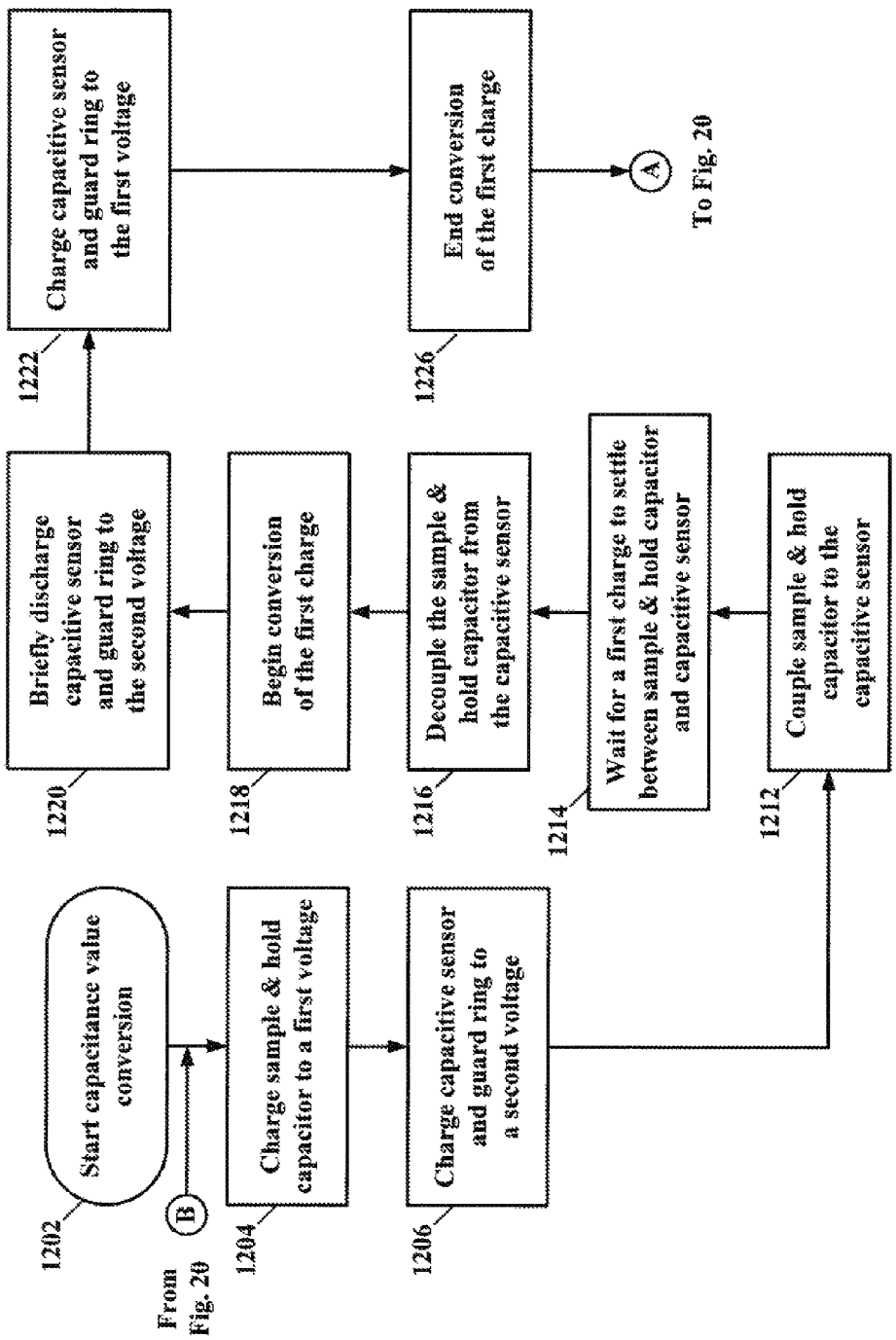
FIGS. 19 and 20 illustrate schematic process flow diagrams of capacitive conversions, according to another specific example embodiment of this disclosure.

Referring to FIGS. 19 and 20, depicted are schematic process flow diagrams of capacitive conversions, according to another specific example embodiment of this disclosure. The schematic process flow diagrams depicted in FIGS. 19 and 18 represent operation of the mixed signal integrated circuit device having CVD processing capabilities shown in FIGS. 11, 12 and 16. For a first capacitive measurement the following steps may be performed. In step 1202 a capacitance value conversion is started. In step 1204 the sample and hold capacitor combination of the capacitors 906 and 916 are charged to a first voltage. In step 1206 the capacitive sensor and, optionally, the capacitive sensor guard ring are charged to a second voltage. The first voltage may be Vdd and the second voltage may be Vss or visa versa. Optionally, the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors.

In step 1212 the sample and hold capacitor combination, previously charged to the first voltage, is coupled to the capacitive sensor, previously charged to the second voltage. In step 1214 the sample and hold capacitor and the capacitive sensor are coupled together long enough in time for a complete settling to a common quiescent first charge. Then in step 1216 the sample and hold capacitor is decoupled from the capacitive sensor and the sample and hold capacitor thereafter retains the settled first charge. In step 1218 conversion to a digital representation of the first charge stored in the sample and hold capacitor begins.

In step 1220 the capacitive sensor and, optionally, the guard ring are briefly discharged to the second voltage. In step 1222 the capacitive sensor and, optionally, the guard ring are charged to the first voltage. Optionally, the capacitive sensor guard ring may be charged to the first voltage so as to minimize parasitic capacitance that would otherwise develop at the capacitive sensor due to electrostatic charge caused by a difference of voltage potential between the capacitive sensor and adjacent conductors. In step 1226 the conversion of the first charge to a digital representation thereof terminates and is then read by the digital processor 106 for determining the capacitance value of the capacitive sensor 108.

For an optional second capacitive measurement the following steps may be performed. In step 1228 the sample and hold capacitor combination of the capacitors 906 and 916 are charged to the second voltage. In step 1230 the capacitive sensor and, optionally, the capacitive sensor guard ring are charged to the first voltage. Optionally, the capacitive sensor guard ring may be charged to the first voltage so as to minimize parasitic capacitance that would otherwise develop at the capacitive sensor due to electrostatic charge caused by a difference of voltage potential between the capacitive sensor and adjacent conductors.

In step 1236 the sample and hold capacitor combination, previously charged to the second voltage level, is coupled to the capacitive sensor, previously charged to the first voltage. In step 1238 the sample and hold capacitor combination and the capacitive sensor are coupled together long enough in time for a complete settling to a quiescent second charge. Then in step 1240 the sample and hold capacitor is decoupled from the capacitive sensor and the sample and hold capacitor thereafter retains the settled second charge). In step 1242 a conversion to a digital representation of the second charge stored in the sample and hold capacitor begins.

In step 1244 the capacitive sensor and, optionally, the guard ring are briefly discharged to the first voltage. In step 1246 the capacitive sensor and, optionally, the guard ring are charged to the second voltage. Optionally, the capacitive sensor guard ring may be charged to the second voltage so as to minimize parasitic capacitance that would otherwise develop at the capacitive sensor due to electrostatic charge caused by a difference of voltage potential between the capacitive sensor and adjacent conductors. In step 1250 the conversion of the second charge to a digital representation thereof terminates and is then read by the digital processor 106 for determining the capacitance value of the capacitive sensor 108. An advantage of obtaining both first and second charge conversions is that they may be processed to reduce common mode noise and interference, e.g., 60 Hz power line interference.

What is claimed is:

1. A microcontroller comprising:
    a plurality of ports coupled with an analog bus;
    an analog to digital converter coupled with the analog bus, wherein the an analog to digital converter comprises a main sample and hold capacitor;
    a plurality of additional sample and hold capacitances which can be programmably coupled in parallel with said main sample and hold capacitance such that depending on a selection of additional sample and hold capacitances the capacitance of a resulting sample and hold can be varied, wherein the resulting sample and hold capacitor samples and holds a voltage to be measured by the analog to digital converter.

2. The microcontroller according to claim 1, further comprising a register controlling a plurality of switches for coupling said additional sample and hold capacitances in parallel to said main sample an hold capacitance.

3. The microcontroller according to claim 1, further comprising a programmable control unit for automatically measuring a capacitance of an external sensor coupled with the analog bus through an external port of said microcontroller.

4. The microcontroller according to claim 3, wherein the microcontroller is configured to store the measured value of said external sensor and automatically add one or more of said additional sample and hold capacitances to said main sample and hold capacitance when said external sensor is coupled to the ADC for measurement.

5. The ADC module according to claim 4, wherein the microcontroller is configured to store the measured value of said external sensor and automatically add one or more of said additional sample and hold capacitances to said main sample and hold capacitance when said external sensor is coupled to the ADC for measurement.

6. The method according to claim 3, wherein the microcontroller is configured to store the measured value of said external sensor and automatically add one or more of said additional sample and hold capacitances to said main sample and hold capacitance when said external sensor is coupled to the ADC for measurement.

7. The ADC module according to claim 1, further comprising a register controlling a plurality of switches for coupling said additional sample and hold capacitances in parallel to said main sample an hold capacitance.

8. The ADC module according to claim 1, further comprising a programmable control unit for automatically measuring a capacitance of an external sensor coupled with the analog bus through an external port of said microcontroller.

9. The method according to claim 1, further comprising providing a register controlling a plurality of switches for coupling said additional sample and hold capacitances in parallel to said main sample an hold capacitance.

10. The method according to claim 1, further providing comprising a programmable control unit for automatically measuring a capacitance of an external sensor coupled with the analog bus through an external port of said microcontroller.

11. An ADC module, comprising:
    an analog to digital converter coupled with an analog bus, wherein the an analog to digital converter comprises a main sample and hold capacitor; and
    a plurality of additional sample and hold capacitances which can be programmably coupled in parallel with said main sample and hold capacitance, such that depending on a selection of additional sample and hold capacitances the capacitance of a resulting sample and hold can be varied, wherein the resulting sample and hold capacitor samples and holds a voltage to be measured b the analog to digital converter.

12. A method, comprising:
    providing a plurality of ports coupled with an analog bus;
    providing an analog to digital converter coupled with the analog bus, wherein the an analog to digital converter comprises a main sample and hold capacitor;
    providing a plurality of additional sample and hold capacitors which can be programmably coupled in parallel with said main sample and hold capacitor,
    selecting a number of said additional sample and hold capacitors to be coupled in parallel with said main sample and hold capacitor to form a resulting sample and hold capacitor, wherein the number can be programmed to vary between a minimum and a maximum number of said plurality of additional sample and hold capacitors, sampling a voltage to be measured by the resulting sample and hold capacitor;

determining said voltage by the analog to digital converter.

13. A microcontroller comprising:

a plurality of ports coupled with an analog bus;

an analog to digital converter coupled with the analog bus, wherein the an analog to digital converter comprises a main sample and hold capacitor having a first terminal coupled with an operational amplifier and a second terminal coupled with the analog bus;

a plurality of additional sample and hold capacitances which can be programmably coupled in parallel and connected with said second terminal of the main sample and hold capacitance such that depending on a selection of additional sample and hold capacitances the capacitance of a resulting sample and hold can be varied.

14. The microcontroller according to claim 13, further comprising a register controlling a plurality of switches for coupling said additional sample and hold capacitances in parallel to said main sample an hold capacitance.

15. The microcontroller according to claim 13, further comprising a programmable control unit for automatically measuring a capacitance of an external sensor coupled with the analog bus through an external port of said microcontroller.

16. The microcontroller according to claim 15, wherein the microcontroller is configured to store the measured value of said external sensor and automatically add one or more of said additional sample and hold capacitances to said main sample and hold capacitance when said external sensor is coupled to the ADC for measurement.

* * * * *